(12) United States Patent
Kim

(10) Patent No.: US 12,396,310 B2
(45) Date of Patent: Aug. 19, 2025

(54) DISPLAY DEVICE

(71) Applicant: Samsung Display Co., LTD., Yongin-si (KR)

(72) Inventor: Geun Tak Kim, Hwaseong-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 467 days.

(21) Appl. No.: 17/977,076

(22) Filed: Oct. 31, 2022

(65) Prior Publication Data

US 2023/0307485 A1   Sep. 28, 2023

(30) Foreign Application Priority Data

Mar. 23, 2022   (KR) .................. 10-2022-0036005

(51) Int. Cl.
*H10H 29/14*     (2025.01)
*H10H 20/821*    (2025.01)
(Continued)

(52) U.S. Cl.
CPC ........ *H10H 29/142* (2025.01); *H10H 20/821* (2025.01); *H10H 20/84* (2025.01);
(Continued)

(58) Field of Classification Search
CPC .... H10H 29/142; H10H 20/821; H10H 20/84; H10H 29/012; H10H 29/03; H10H 29/30; H10H 29/37; H10H 29/49; H10H 20/819; H10H 20/01; H10H 20/857; H10H 20/813; H10H 20/8316; H01L 25/0753; H01L 33/62; H01L 33/387; H01L 33/20; H01L 33/08; H01L 33/0095; H01L 33/24; H01L 33/44; H01L 27/156
See application file for complete search history.

(56) References Cited

U.S. PATENT DOCUMENTS 11,908,849 B2 *   2/2024   Lee ..................... H01L 25/0753
11,984,368 B2 *   5/2024   Ko ........................ H10H 20/857
(Continued)

FOREIGN PATENT DOCUMENTS

KR   10-2019-0029831   3/2019
KR   10-2020-0042075   4/2020

*Primary Examiner* — Earl N Taylor
(74) *Attorney, Agent, or Firm* — KILE PARK REED & HOUTTEMAN PLLC

(57) ABSTRACT

A display device includes a bank layer disposed on a substrate and defining a light-emitting area and a sub-area, a first electrode and a second electrode spaced apart from each other and extending from the light-emitting area to the sub-area, a plurality of light-emitting elements disposed on the first electrode and the second electrode in the light-emitting area, a plurality of dummy light-emitting elements disposed on the first electrode and the second electrode in the sub-area, a first connection electrode in electrical contact with an end of each of the plurality of light-emitting elements, and a second connection electrode in electrical contact with another end of each of the plurality of light-emitting elements. The sub-area includes an isolation area in which each of the first electrode and the second electrode is disconnected, and the plurality of dummy light-emitting elements are not disposed in the isolation area.

20 Claims, 12 Drawing Sheets

(51) Int. Cl.
*H10H 20/84* (2025.01)
*H10H 29/01* (2025.01)
*H10H 29/03* (2025.01)
*H10H 29/30* (2025.01)
*H10H 29/37* (2025.01)
*H10H 29/49* (2025.01)

(52) U.S. Cl.
CPC .......... *H10H 29/012* (2025.01); *H10H 29/03* (2025.01); *H10H 29/30* (2025.01); *H10H 29/37* (2025.01); *H10H 29/49* (2025.01)

(56) References Cited

U.S. PATENT DOCUMENTS

| | | | |
|---|---|---|---|
| 2011/0089850 A1* | 4/2011 | Shibata | H05B 45/00 257/E33.001 |
| 2019/0244985 A1* | 8/2019 | Kim | H10H 20/8316 |
| 2021/0280753 A1* | 9/2021 | Kim | H10H 20/01 |
| 2021/0320231 A1* | 10/2021 | Kim | H10H 29/8514 |
| 2021/0335883 A1* | 10/2021 | Park | G09G 3/32 |
| 2021/0366888 A1* | 11/2021 | Kim | H10H 20/857 |
| 2021/0375194 A1* | 12/2021 | Kwag | G09G 3/32 |
| 2022/0044976 A1* | 2/2022 | Ko | H10H 20/857 |
| 2022/0077228 A1* | 3/2022 | Do | H10H 20/831 |
| 2022/0093828 A1* | 3/2022 | Kwag | H10H 20/857 |
| 2022/0149111 A1* | 5/2022 | Lee | H01L 25/0753 |
| 2022/0189939 A1* | 6/2022 | Lee | H01L 25/167 |
| 2022/0302178 A1* | 9/2022 | Cha | H10D 86/0251 |
| 2022/0328528 A1* | 10/2022 | Lee | H01L 25/167 |

* cited by examiner

RME: RME1, RME2, RME3

RME: RME1, RME2, RME3
RME1: RM_E1, RM_E2, RM_B1, RM_B2, RM_B3, RM_B4
RME2: RM_P1, RM_P2
RME3: RM_P3, RM_P4

RME: RME1, RME2, RME3
RME1: RM_E1, RM_E2, RM_B1, RM_B2, RM_B3, RM_B4
RME2: RM_E3, RM_E4, RM_P1, RM_P2
RME3: RM_E5, RM_E6, RM_P3, RM_P4
EED: EED1, EED2, EED3, EED4

DISPLAY DEVICE

CROSS-REFERENCE TO RELATED APPLICATION

This application claims priority to and benefits of Korean Patent Application No. 10-2022-0036005 under 35 U.S.C. 119, filed on Mar. 23, 2022, in the Korean Intellectual Property Office (KIPO), the contents of which are herein incorporated by reference in their entireties.

BACKGROUND

1. Technical Field

The disclosure relates to a display device.

2. Description of Related Art

A display device has increasing importance under development of multimedia. In response to this trend, various types of the display devices such as an organic light-emitting display device (OLED), a liquid crystal display device (LCD), etc. have been used.

A display device that displays an image has a display panel such as an organic light-emitting display panel or a liquid crystal display panel. The light-emitting display panel may include a light-emitting element. For example, a light-emitting diode (LED) as the light-emitting element may include an organic light-emitting diode OLED using an organic material as a light-emitting material and an inorganic light-emitting diode using an inorganic material as the light-emitting material.

SUMMARY

A purpose of the disclosure is to provide a display device capable of preventing occurrence of poor isolation between electrodes due to overflow of ink.

Purposes according to the disclosure are not limited to the above-mentioned purpose. Other purposes and advantages according to the disclosure that are not mentioned may be understood based on following descriptions, and may be more clearly understood based on embodiments of the disclosure. Further, it will be readily understood that the purposes and advantages according to the disclosure may be realized using means shown in the claims and combinations thereof.

According to an embodiment of the disclosure, a display device may include a bank layer disposed on a substrate and defining a light-emitting area and a sub-area spaced apart from the light-emitting area, a first electrode and a second electrode spaced apart from each other and extending from the light-emitting area to the sub-area, a plurality of light-emitting elements disposed on the first electrode and the second electrode in the light-emitting area, a plurality of dummy light-emitting elements disposed on the first electrode and the second electrode in the sub-area, a first connection electrode in electrical contact with an end of each of the plurality of light-emitting elements, and, a second connection electrode in electrical contact with another end of each of the plurality of light-emitting elements. The sub-area may include an isolation area in which each of the first electrode and the second electrode is disconnected, and the plurality of dummy light-emitting elements may be not disposed in the isolation area.

In an embodiment, each of the plurality of dummy light-emitting elements may be spaced apart from the first connection electrode and the second connection electrode.

In an embodiment, in the sub-area, the first electrode may include a first stem, a second stem spaced apart from the first stem, a first branch protruding from the first stem toward the second electrode, and a second branch protruding from the second stem toward the second electrode. The isolation area may be disposed between the first stem and the second stem.

In an embodiment, in the sub-area, the second electrode may include a third stem, a fourth stem spaced apart from the third stem, a first protrusion protruding from the third stem toward the first electrode, and a second protrusion protruding from the fourth stem toward the first electrode. The isolation area may be disposed between the third stem and the fourth stem.

In an embodiment, the first branch and the first protrusion may extend in a parallel manner to each other and face each other, and the second branch and the second protrusion may extend in a parallel manner to each other and face each other.

In an embodiment, the plurality of dummy light-emitting elements may include a first dummy light-emitting element disposed between the first branch and the first protrusion, and a second dummy light-emitting element disposed between the second branch and the second protrusion.

In an embodiment, the first stem, the first branch, the third stem, and the first protrusion may be respectively symmetrical with the second stem, the second branch, the fourth stem, and the second protrusion with respect to the isolation area.

In an embodiment, widths of the first branch and the second branch may be equal to each other, lengths of the first branch and the second branch may be equal to each other, widths of the first protrusion and the second protrusion may be equal to each other, and lengths of the first protrusion and the second protrusion may be equal to each other.

In an embodiment, the device may further include a third electrode extending from the light-emitting area to the sub-area. The third electrode may be spaced apart from the second electrode, the first electrode may be disposed between the second electrode and the third electrode, and the third electrode may be disconnected in the isolation area.

In an embodiment, in the sub-area, the first electrode may include a third branch protruding from the first stem toward the third electrode, and a fourth branch protruding from the second stem toward the third electrode.

In an embodiment, in the sub-area, the third electrode may include a fifth stem, a sixth stem spaced apart from the fifth stem, a third protrusion protruding from the fifth stem toward the first electrode, and a fourth protrusion protruding from the sixth stem toward the first electrode. The isolation area may be disposed between the fifth stem and the sixth stem.

In an embodiment, the third branch and the third protrusion may extend in a parallel manner to each other and face each other, and the fourth branch and the fourth protrusion may extend in a parallel manner to each other and face each other.

In an embodiment, the plurality of dummy light-emitting elements may include a third dummy light-emitting element disposed between the third branch and the third protrusion, and a fourth dummy light-emitting element disposed between the fourth branch and the fourth protrusion.

In an embodiment, the third branch, the fifth stem, and the third protrusion may be respectively symmetrical with the fourth branch, the sixth stem, and the fourth protrusion with respect to the isolation area.

In an embodiment, the third branch and the fourth branch may have a same width and a same length, and the third protrusion and the fourth protrusion may have a same width and a same length.

According to an embodiment of the disclosure, a display device may include a bank layer disposed on a substrate and defining a light-emitting area and a sub-area spaced apart from the light-emitting area, electrodes including a first electrode and a second electrode spaced apart from each other and extending from the light-emitting area to the sub-area, a plurality of light-emitting elements disposed on the first electrode and the second electrode in the light-emitting area, a plurality of dummy light-emitting elements disposed on the first electrode and the second electrode in the sub-area, a first connection electrode in electrical contact with an end of each of the plurality of light-emitting elements, and a second connection electrode in electrical contact with another end of each of the plurality of light-emitting elements. Each of the plurality of dummy light-emitting elements may be spaced apart from the first connection electrode and the second connection electrode.

In an embodiment, the device may further include a first insulating layer disposed between the electrodes and the plurality of dummy light-emitting elements. An end of each of the plurality of dummy light-emitting elements may be disposed on the first electrode, and another end of each of the plurality of dummy light-emitting element may be disposed on the second electrode.

In an embodiment, the device may further include a second insulating layer disposed on the plurality of dummy light-emitting elements and the first insulating layer. The second insulating layer may be in direct contact with a top face and sides of each of the plurality of dummy light-emitting elements.

In an embodiment, in the sub-area, the first electrode may include a first stem, the second electrode may include a second stem, a width of the first stem may be smaller than a width of the first electrode in the light-emitting area, and a width of the second stem may be smaller than a width of the second electrode in the light-emitting area.

In an embodiment, each of the plurality of dummy light-emitting elements may be disposed between the first electrode the second electrode, and each of the plurality of dummy light-emitting elements may be not disposed between the first stem and the second stem.

According to the display device according to embodiments, even in case that the ink containing the light-emitting elements overflows into the sub-area, the alignment signal may be applied to each of the electrodes to move the light-emitting elements to an area other than the isolation area of the sub-area and to align the light-emitting elements with each other. This may prevent poor isolation between the electrodes due to the light-emitting elements in the isolation area.

Effects of the disclosure are not limited to the above-mentioned effects, and other effects not mentioned will be clearly understood by those skilled in the art from following descriptions.

BRIEF DESCRIPTION OF DRAWINGS

The above and other aspects and features of the disclosure will become more apparent by describing in detail illustrative embodiments thereof with reference to the attached drawings, in which.

DETAILED DESCRIPTIONS OF THE EMBODIMENTS

Figure 1:
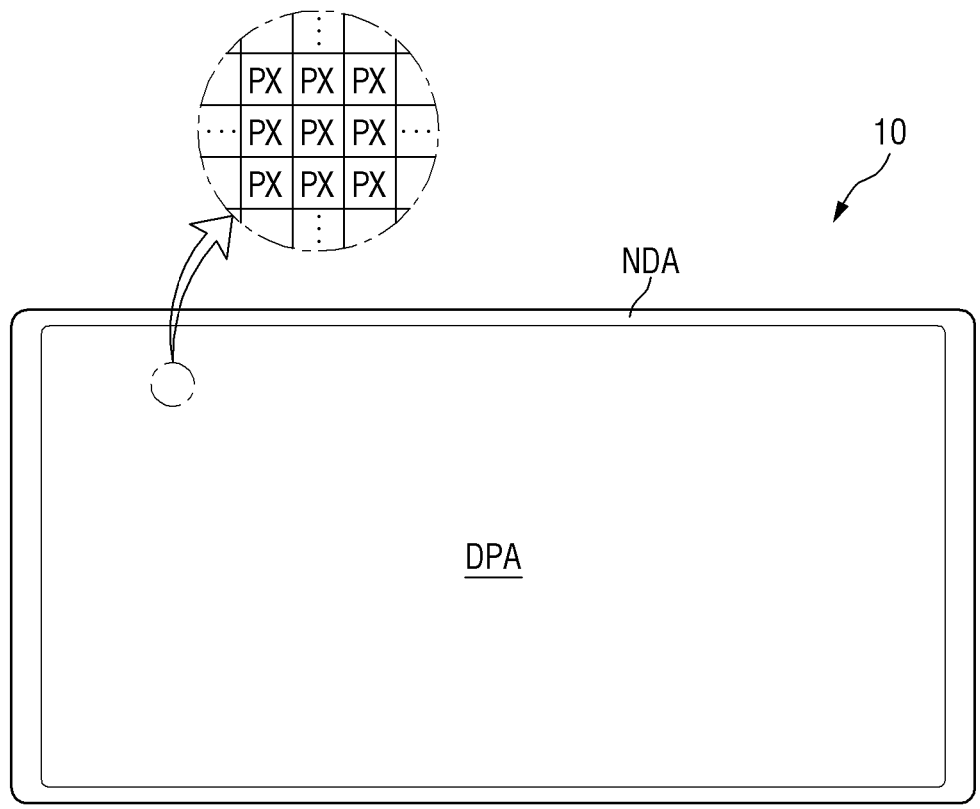
FIG. 1 is a schematic plan view of a display device according to an embodiment.
Figure 1:
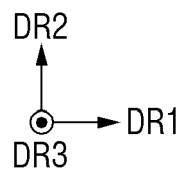

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

When an element, such as a layer, is referred to as being "on", "connected to", or "coupled to" another element or layer, it may be directly on, connected to, or coupled to the other element or layer or intervening elements or layers may be present. When, however, an element or layer is referred to as being "directly on", "directly connected to", or "directly coupled to" another element or layer, there are no intervening elements or layers present. To this end, the term "connected" may refer to physical, electrical, and/or fluid connection, with or without intervening elements.

Spatially relative terms, such as "beneath", "below", "under", "lower", "above", "upper", "over", "higher", "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below", for example, can encompass both an orientation of above and below. Furthermore, the apparatus may be otherwise oriented (e.g., rotated 90 degrees or at other orientations), and, as such, the spatially relative descriptors used herein interpreted accordingly.

The terms "above," "top" and "top surface" as used herein refer to an upward direction (i.e., a Z-axis direction) with respect to the display device. The terms "below," "bottom" and "bottom surface" as used herein refer to a downward direction (i.e., a direction opposite to the Z-axis direction) with respect to the display device. Further, the terms "left," "right," "upper," and "lower" respectively indicate corresponding directions on the surface of the display device. For example, the term "left" indicates a direction opposite to an X-axis direction, the term "right" indicates the X-axis direction, the term "upper" indicates a Y-axis direction, and the term "lower" indicates a direction opposite to the Y-axis direction.

The terminology used herein is for the purpose of describing particular embodiments and is not intended to be limiting. As used herein, the singular forms, "a", "an", and "the" are intended to include the plural forms as well, unless the context clearly indicates otherwise. Moreover, the terms "comprises", "comprising", "includes", and/or "including" when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially", "about", and other similar terms, are used as terms of approximation and not as terms of degree, and, as such, are utilized to account for inherent deviations in measured, calculated, and/or provided values that would be recognized by one of ordinary skill in the art.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YA, and ZZ. As used herein, the term "and/or" includes any and all combinations of one or more of the associated listed items.

Each of the features of the various embodiments of the disclosure may be combined or combined with each other, in part or in whole, and technically various interlocking and driving are possible. Each embodiment may be implemented independently of each other or may be implemented together in an association.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, specific embodiments will be described with reference to the accompanying drawings.

FIG. 1 is a schematic plan view of a display device according to an embodiment.

Referring to FIG. 1, a display device 10 may display a video or a still image. The display device 10 may be any electronic device that provides a display screen. For example, the display device 10 may be a televisions, a laptop, a monitors, a billboard, an Internet of Thing, a mobile phone, a smart phone, a tablet PC (personal computer), an electronic watch, a smart watch, a watch phone, a head mounted display (HMD), a mobile communication terminal, an electronic notebook, an e-book, a PMP (Portable Multimedia Player), a navigation device, a game device, a digital camera, a camcorder, etc. which may provide a display screen.

The display device 10 may include a display panel that provides a display screen. Examples of the display panel may include an inorganic light-emitting diode display panel, an organic light-emitting display panel, a quantum dot light-emitting display panel, a plasma display panel, and a field emission display panel. Hereinafter, an embodiment in which the inorganic light-emitting diode display panel is embodied as the display panel will be described. However, the disclosure is not limited thereto. When the same technical idea is applicable to other display panels, the disclosure may also be applied to the other display panels.

In the drawings for illustrating the display device 10, the first direction DR1, the second direction DR2, and the third direction DR3 are defined. The first direction DR1 and the second direction DR2 may be perpendicular to each other and constitute one plane. The third direction DR3 may be normal to the plane which the first direction DR1 and the second direction DR2 constitute. The third direction DR3 may be perpendicular to each of the first direction DR1 and the second direction DR2. In an embodiment describing the display device 10, the third direction DR3 may indicate a thickness direction of the display device 10.

A shape of the display device 10 may be variously modified. For example, the display device 10 may have a rectangular shape including a long-side extending in the first direction DR1 and a short-side extending in the second direction DR2 in a plan view. In another example, the display device 10 may have a rectangular shape including a long-side extending in the second direction DR2 and a short-side extending in the first direction DR1 in a plan view. However, the disclosure is not limited thereto. The display device 10 may have a shape such as a square, a rectangle with rounded corners, other polygons, or a circle. A shape of a display area DPA of the display device 10 may be similar to an overall shape of the display device 10. In FIG. 1, an embodiment in which each of the display device 10 and the display area DPA has a rectangular shape having a long-side extending in the first direction DR1 and a short-side extending in the second direction DR2 is illustrated.

The display device 10 may include a display area DPA and a non-display area NDA. The display area DPA may be an area where a screen is displayed, while the non-display area NDA may be an area where the screen is not displayed. The display area DPA may be referred to as an active area, and the non-display area NDA may be referred to as a non-active area. The display area DPA may occupy generally an inner region of the display device 10.

The display area DPA may include multiple pixels PX. The pixels PX may be arranged in a matrix form. A shape of each pixel PX may be rectangular or square in a plan view. However, the disclosure is not limited thereto. The shape thereof may be a rhombus shape in which each side is inclined relative to one direction. The pixels PX may be alternately arranged in a stripe type or a PenTile™ type. Further, each of the pixel PXs may include one or more light-emitting elements emitting light of a specific wavelength band to display a specific color.

The non-display area NDA may be disposed adjacent to the display area DPA. The non-display area NDA may completely or partially surround the display area DPA. The display area DPA may have a rectangular shape, while each non-display area NDA may be disposed adjacent to each of four sides of the display area DPA. The non-display area NDA may constitute a bezel of the display device 10. Lines or circuit drivers included in the display device 10 may be disposed in the non-display area NDA. External devices may be mounted in the non-display area NDA.

Figure 2:
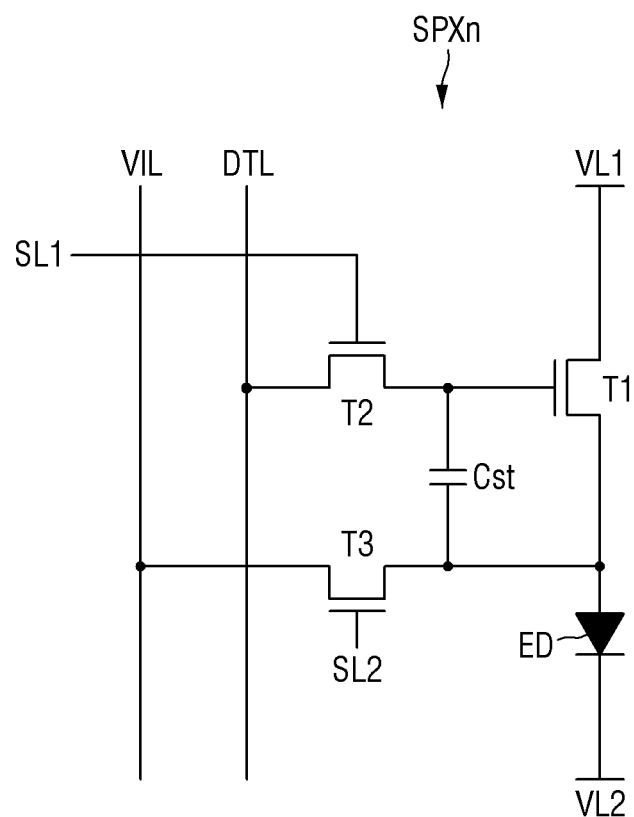
FIG. 2 is a schematic diagram of an equivalent circuit of a sub-pixel of a display device according to an embodiment.

FIG. 2 is a schematic diagram of an equivalent circuit of a sub-pixel of a display device according to an embodiment.

Referring to FIG. 2, each sub-pixel SPXn of the display device 10 according to an embodiment may include a light-emitting element ED, three transistors T1, T2, and T3 and one storage capacitor Cst.

The light-emitting element ED may emit light in response to a current supplied thereto through a first transistor T1. The light-emitting element ED may emit light of a specific wavelength band in response to an electrical signal transmitted from the first electrode and the second electrode respectively electrically connected to both opposing ends thereof.

An end of the light-emitting element ED may be electrically connected to a source electrode of the first transistor T1, and another end thereof may be electrically connected to a second voltage line VL2 to which a low-potential voltage (hereinafter, a second power voltage) lower than a high-potential voltage (hereinafter, a first power voltage) of a first voltage line VL1 is supplied.

The first transistor T1 may adjust a current flowing from the first voltage line VL1 to which the first power voltage is supplied to the light-emitting element ED, based on a difference between voltages of a gate electrode and the source electrode thereof. In an embodiment, the first transistor T1 may act as a driving transistor for driving the light-emitting element ED. The gate electrode of the first transistor T1 may be electrically connected to a source electrode of a second transistor T2, the source electrode thereof may be electrically connected to an end of the light-emitting element ED, and a drain electrode thereof may be electrically connected to the first voltage line VL1 to which the first power voltage is applied.

The second transistor T2 may be turned on by a scan signal of a first scan line SL1 to electrically connect a data line DTL to the gate electrode of the first transistor T1. A gate electrode of the second transistor T2 may be electrically connected to the first scan line SL1, the source electrode thereof may be electrically connected to the gate electrode of the first transistor T1, and a drain electrode thereof may be electrically connected to the data line DTL.

A third transistor T3 may be turned on by a scan signal of a second scan line SL2 to electrically connect an initialization voltage line VIL to the end of the light-emitting element ED. A gate electrode of the third transistor T3 may be electrically connected to the second scan line SL2, a drain electrode thereof may be electrically connected to the initialization voltage line VIL, and a source electrode thereof may be electrically connected to the end of the light-emitting element ED and the source electrode of the first transistor T1. In the drawing, the first scan line SL1 and the second scan line SL2 are shown separately. The disclosure is not limited thereto. In another embodiment, the first scan line SL1 and the second scan line SL2 may be integrated into a single line. The second transistor T2 and the third transistor T3 may be simultaneously turned on by a same scan signal.

Figure 4:
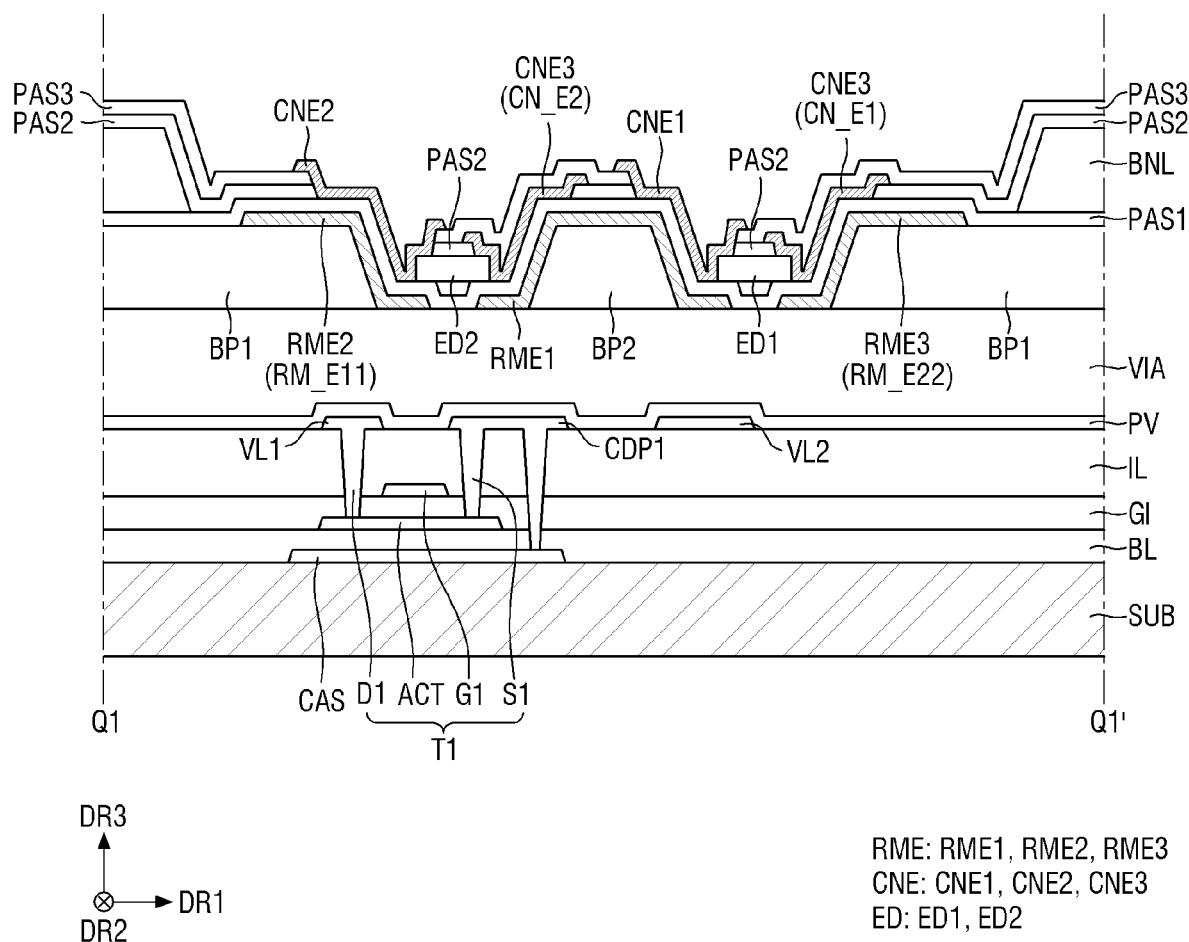
FIG. 4 is a schematic cross-sectional view taken along line Q1-Q1' in FIG. 3.

The source electrode and the drain electrode of each of the transistors T1, T2, and T3 are not limited to the above configuration. For example, the source electrode and the drain electrode of each of the transistors T1, T2, and T3 may have a configuration opposite to the above configuration. Each of the transistors T1, T2, and T3 may be embodied as a thin-film transistor. In FIG. 4, each of the transistors T1, T2, and T3 is embodied as an N-type MOSFET (Metal Oxide Semiconductor Field Effect Transistor). The disclosure is not limited thereto. For example, each of the transistors T1, T2, and T3 may be embodied as a P-type MOSFET. In another embodiment, some thereof may be embodied as an N-type MOSFET, and the other thereof may be embodied as a P-type MOSFET.

The storage capacitor Cst may be disposed between the gate electrode and the source electrode of the first transistor T1. The storage capacitor Cst may store therein a difference voltage between a gate voltage and a source voltage of the first transistor T1.

Figure 3:
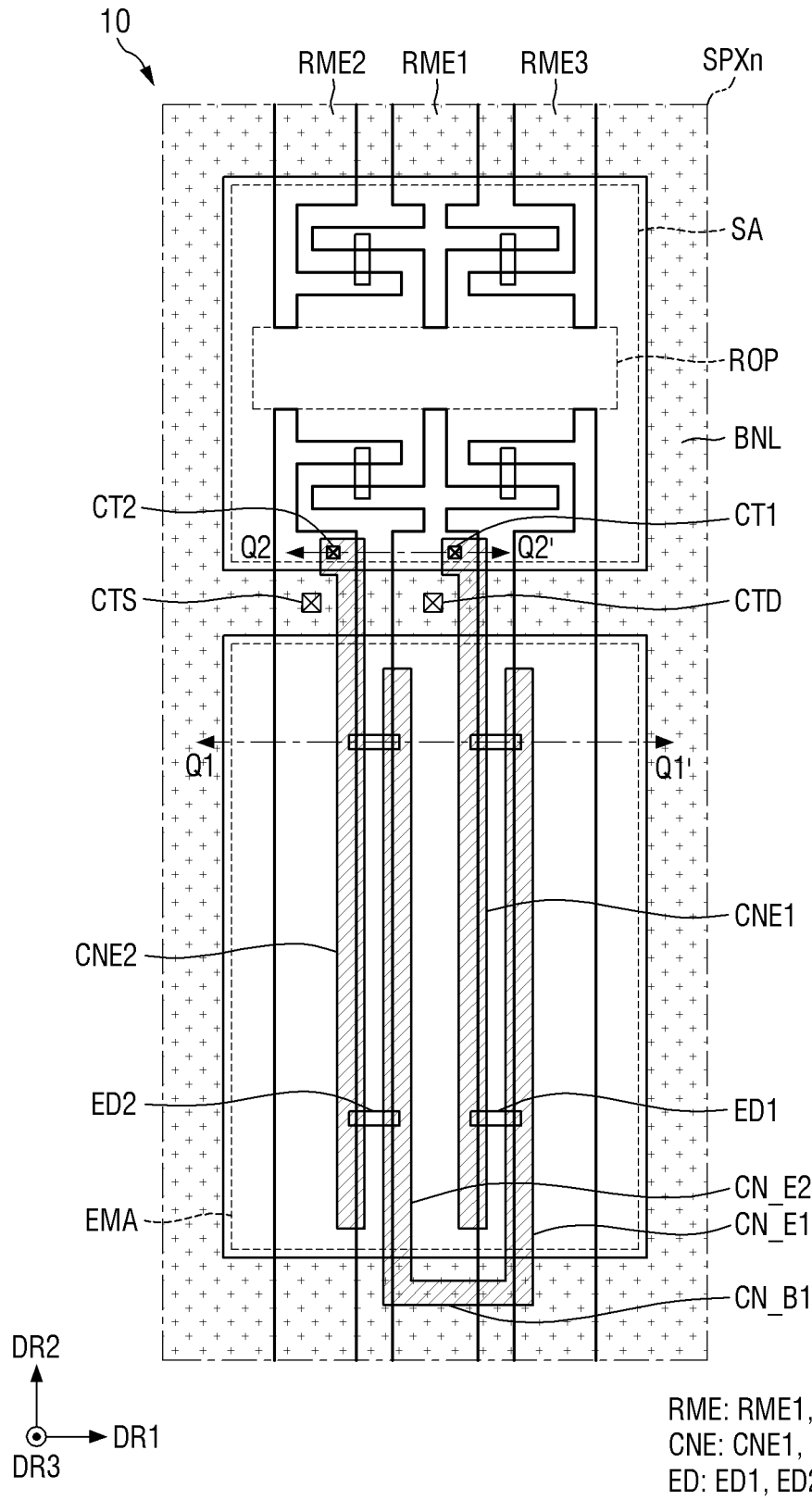
FIG. 3 is a plan view schematically showing one sub-pixel of a display device according to an embodiment.
Figure 5:
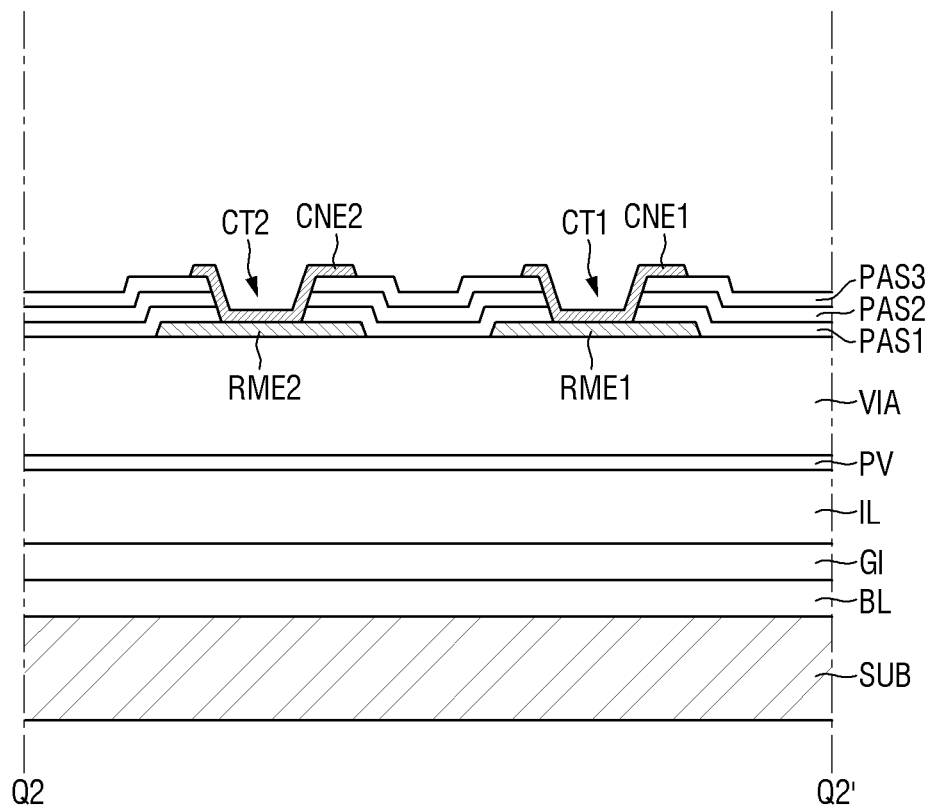
FIG. 5 is a schematic cross-sectional view taken along line Q2-Q2' in FIG. 3.
Figure 5:
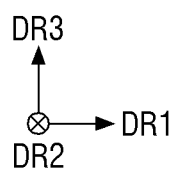

FIG. 3 is a plan view schematically showing one sub-pixel of a display device according to an embodiment. FIG. 4 is a schematic cross-sectional view taken along line Q1-Q1' in FIG. 3. FIG. 5 is a schematic cross-sectional view taken along line Q2-Q2' in FIG. 3.

Referring to FIG. 3 to FIG. 5, a display device according to an embodiment may include multiple sub-pixels SPXn. Three or more sub-pixels SPXn may constitute one pixel. Each sub-pixel SPXn may emit light of any one of a first color, a second color, or a third color. For example, the first color may be blue, the second color may be green, and the third color may be red. However, the disclosure is not limited thereto, and the sub-pixels SPXn may emit light of the same color.

Each sub-pixel SPXn of the display device 10 may include a light-emitting area EMA and a non-light-emitting area (not referenced). The light-emitting area EMA may be an area in which the light-emitting element ED is disposed and thus from which light in a specific wavelength band is emitted. The non-light-emitting area may be an area in which the light-emitting element ED is not disposed and which light emitted from the light-emitting element ED does not reach, and thus from which light is not emitted. The light-emitting area may include an area in which the light-emitting element ED is disposed and an area adjacent to the light-emitting element ED and toward which light emitted from the light-emitting element ED is emitted.

However, the disclosure is not limited thereto. The light-emitting area EMA may include an area toward which the light emitted from the light-emitting element ED is reflected from or refracted through other members and is directed. Multiple light-emitting elements ED may be arranged in each sub-pixel SPXn. An area in which the elements ED are disposed and an area adjacent thereto may constitute the light-emitting area EMA.

Each sub-pixel SPXn may include a sub-area SA disposed in the non-light-emitting area. The sub-area SA may be disposed on a side of the light-emitting area EMA in the second direction DR2. The sub-area SA may be disposed between light-emitting areas EMA of neighboring sub-pixels SPXn in the second direction DR2. Multiple light-emitting areas EMA and sub-areas SA may be arranged in the display area DPA of the display device 10. For example, the light-emitting areas EMA may be repeatedly arranged in the first direction DR1, and the sub-areas SA may be repeatedly arranged in the first direction DR1. The light-emitting areas EMA and the sub-areas SA may be alternately arranged with each other in the second direction DR2. A bank layer BNL may be disposed between each of the sub-areas SA and each of the light-emitting areas EMA. A spacing therebetween may vary depending on a width of the bank layer BNL. No light may be emitted from the sub-area SA. Portions of electrodes RME disposed in each sub-pixel SPXn may extend to the sub-area SA. The electrodes RME disposed in each sub-pixel SPXn may be disconnected from each other in the sub-area SA.

The display device 10 according to an embodiment may include a substrate SUB and a semiconductor layer, multiple conductive layers, and multiple insulating layers disposed on the substrate SUB. The semiconductor layer, the conductive layer, and the insulating layers may constitute a circuit layer and a display element layer of the display device 10.

The substrate SUB may be an insulating substrate. The substrate SUB may include an insulating material such as glass, quartz, or polymer resin. The substrate SUB may be a rigid substrate or may be a flexible substrate capable of bending, folding, rolling, etc.

A first conductive layer may be disposed on the substrate SUB. The first conductive layer may include a lower metal layer CAS, and the lower metal layer CAS may be disposed to overlap an active layer ACT of a first transistor T1. The lower metal layer CAS may include a light-blocking material to prevent light from entering the active layer ACT of the first transistor T1. However, the lower metal layer CAS may be omitted.

A buffer layer BL may be disposed on the lower metal layer CAS and the substrate SUB. The buffer layer BL may be formed on the substrate SUB to protect transistors from moisture penetrating through the substrate SUB, which is vulnerable to moisture permeation, and may perform a surface planarization function.

The semiconductor layer may be disposed on the buffer layer BL. The semiconductor layer may include an active layer ACT of the first transistor T1. The active layer ACT may be disposed to partially overlap a gate electrode G1 of the second conductive layer, which will be described later.

The semiconductor layer may include at least one of polycrystalline silicon, single crystal silicon, oxide semiconductor, and the like. In another embodiment, the semiconductor layer may include (or be formed of) polycrystalline silicon. The oxide semiconductor may be an oxide semiconductor containing indium (In). For example, the oxide semiconductor may include at least one of Indium Tin Oxide (ITO), Indium Zinc Oxide (IZO), Indium Gallium Oxide (IGO), Indium Zinc Tin Oxide (IZTO), Indium Gallium Tin Oxide (IGTO), Indium Gallium Zinc Oxide (IGZO), and Indium Gallium Zinc Tin Oxide (IGZTO).

Although the drawing illustrates that one first transistor T1 is disposed in the sub-pixel SPXn of the display device 10, the disclosure is not limited thereto, and the display device 10 may include a larger number of transistors.

A gate insulating layer GI may be disposed on the active layer ACT. The gate insulating layer GI may serve as a gate insulating film of the first transistor T1.

A second conductive layer may be disposed on the gate insulating layer GI. The second conductive layer may include the gate electrode G1 of the first transistor T1. The gate electrode G1 may be disposed to overlap a channel area of the active layer ACT in the third direction DR3, which is the thickness direction.

An interlayer insulating layer IL may be disposed on the second conductive layer. The interlayer insulating layer IL may function as an insulating film between the second conductive layer and other layers disposed thereon and may protect the second conductive layer.

A third conductive layer may be disposed on the interlayer insulating layer IL. The third conductive layer may include a first voltage line VL1, a second voltage line VL2, and a first conductive pattern CDP1.

The first voltage line VL1 may receive a high potential voltage (or a first power voltage delivered to a first electrode RME1). A low-potential voltage (or a second power voltage) transmitted to a second electrode RME2 may be applied to the second voltage line VL2. The first voltage line VL1 may electrically contact the active layer ACT of the first transistor T1 via a contact hole, a portion thereof extends through the interlayer insulating layer IL and the gate insulating layer GI. The first voltage line VL1 may serve as a first drain electrode D1 of the first transistor T1. The second voltage line VL2 may be directly connected to the second electrode RME2, which will be described later. The first voltage line VL1 may be electrically connected to a first connection electrode CNE1 to be described later, and the second voltage line VL2 may be electrically connected to a second connection electrode CNE2 to be described later.

The first conductive pattern CDP1 may electrically contact the active layer ACT of the first transistor T1 via a contact hole extending through the interlayer insulating layer IL and the gate insulating layer GI. The first conductive pattern CDP1 may electrically contact the lower metal layer CAS via another contact hole. The first conductive pattern CDP1 may serve as a source electrode S1 of the first transistor T1.

A protective layer PV may be disposed on the third conductive layer and the interlayer insulating layer IL. The protective layer PV may function as an insulating film between the third conductive layer and other layers disposed thereon and may protect the third conductive layer.

Each of the buffer layer BL, the gate insulating layer GI, the interlayer insulating layer IL, and the protective layer PV as above-described may be embodied as multiple inorganic layers alternately stacked each other. For example, each of the buffer layer BL, the gate insulating layer GI, the interlayer insulating layer IL, and the protective layer PV may be embodied as a stack of two inorganic layers including at least one of silicon oxide ($SiO_x$), silicon nitride ($SiN_x$), or silicon oxynitride ($SiO_xN_y$) or may be embodied as a stack in which multiple inorganic layers including at least one of silicon oxide ($SiO_x$), silicon nitride ($SiN_x$), or silicon oxynitride ($SiO_xN_y$) are alternately stacked each other. However, the disclosure is not limited thereto. Each of the buffer layer BL, the gate insulating layer GI, the interlayer insulating layer IL, and the protective layer PV may be embodied as one inorganic layer including the insulating material described above. In some embodiments, the interlayer insulating layer IL may be made of an organic insulating material such as polyimide (PI).

Each of the second conductive layer and the third conductive layer may be embodied as a single layer or multiple layers including at least one of molybdenum (Mo), aluminum (Al), chromium (Cr), gold (Au), titanium (Ti), nickel (Ni), neodymium (Nd), and copper (Cu), or an alloy thereof. However, the disclosure is not limited thereto.

A via layer VIA may be disposed on the protective layer PV. The via layer VIA may include an organic insulating material such as polyimide (PI) and may perform a surface planarization function.

On the via layer VIA, a display element layer may be disposed which includes multiple electrodes RMEs: RME1, RME2, and RME3, multiple bank patterns BP1 and BP2, multiple light-emitting elements EDs: ED1 and ED2, and multiple connection electrodes CNEs: CNE1, CNE2, and CNE3. Multiple insulating layers PAS1, PAS2, and PAS3 may be also disposed on the via layer VIA.

The bank patterns BP1 and BP2 may be directly disposed on the via layer VIA. The bank patterns BP1 and BP2 may include first bank patterns BP1 and second bank patterns BP2. The first bank patterns BP1 may be disposed in the light-emitting area EMA of the sub-pixel SPXn. Each of the first bank patterns BP1 may have a shape extending in the second direction DR2 may be spaced apart from each other in the first direction DR1. The first bank patterns BP1 may have the same width. However, the disclosure is not limited thereto. The first bank patterns BP1 may have different widths. A length of each of the first bank patterns BP1 extending in the second direction DR2 may be smaller than a length of the light-emitting area EMA surrounded with the bank layer BNL in the second direction DR2.

The second bank pattern BP2 may be disposed in the light-emitting area EMA of the sub-pixel SPXn and may have a shape extending in the second direction DR2. The second bank pattern BP2 may be disposed between the first bank patterns BP1 and spaced apart from the first bank patterns BP1. The second bank pattern BP2 may have an island-like pattern extending in the second direction DR2 over an entirety of the display area DPA and having a narrow width.

The second bank pattern BP2 may be disposed in a center of the light-emitting area EMA. The first bank patterns BP1 may be spaced from each other while the second bank pattern BP2 is interposed therebetween. The first bank patterns BP1 and the second bank pattern BP2 may be alternately arranged in the first direction DR1. The light-emitting elements ED may be disposed between the first bank patterns BP1 and the second bank pattern BP2 spaced apart from each other.

Each of the first bank patterns BP1 and the second bank pattern BP2 may have the same length in the second direction DR2, and may have different widths in the first direction DR1. Each of the bank patterns BP1 and BP2 may be formed in an island-shaped pattern extending over an entirety of the display area DPA. The light-emitting elements ED may be disposed between the bank patterns BP1 and BP2 spaced apart from each other.

Each of the bank patterns BP1 and BP2 may have a structure in which at least a portion thereof protrudes from a top face of the via layer VIA. The protruding portion of each of the bank patterns BP1 and BP2 may have an inclined or curved side face. Unlike what is illustrated in the drawings, each of the bank patterns BP1 and BP2 may have a semicircle or semielliptical shape in a cross-sectional view. Each of the bank patterns BP1 and BP2 may include an organic insulating material such as polyimide (PI). However, the disclosure is not limited thereto.

The electrodes RME may be arranged in each sub-pixel SPXn, and each of the electrodes RME may have a shape extending in a direction. Each of the electrodes RME may extend in the second direction DR2 and may be disposed in the light-emitting area EMA and the sub-area SA of the sub-pixel SPXn. The electrodes RME may be spaced apart from each other in the first direction DR1. The display device 10 may include a first electrode RME1, a second electrode RME2, and a third electrode RME3 disposed in each sub-pixel SPXn. For example, the first electrode RME1 may be disposed in a center of the light-emitting area EMA. The second electrode RME2 (RM_E11) may be spaced apart from the first electrode RME1 in the first direction DR1 and may be disposed at a left side of the center of the light-emitting area EMA. The third electrode RME3 (RM_E22) may be spaced apart from the first electrode RME1 in the first direction DR1 and may be disposed at a left side of the center of the light-emitting area EMA.

The first electrode RME1, the second electrode RME2, and the third electrode RME3 may extend in the second direction DR2. In an isolation area ROP of each sub-area SA, the first electrode RME1, the second electrode RME2, and the third electrode RME3 in a sub-pixel SPXn may be spaced apart from a first electrode RME1, a second electrode RME2, and a third electrode RME3 of adjacent sub-pixel SPXn. This structure of each of the electrodes RME may be formed by disconnecting the electrodes RME after an alignment process of the light-emitting elements ED.

The electrodes RME may be disposed at least on the inclined side face of each of the bank patterns BP1 and BP2. In an embodiment, a width in the first direction DR1 of the first electrode RME1 may be greater than that of the second bank pattern BP2. A width in the first direction DR1 of each of the second electrode RME2 and the third electrode RME3 may be smaller than that of the first bank pattern BP1. At least partial areas of the electrodes RME may be directly disposed on the via layer VIA and may be disposed on the same plane.

The first electrode RME1 may be electrically connected to the third conductive layer via a first electrode contact hole CTD formed in an area overlapping the bank layer BNL. The first electrode RME1 of the sub-pixel SPXn may electrically contact the first conductive pattern CDP1 as the third conductive layer via the first electrode contact hole CTD extends through the via layer VIA and the protective layer PV overlapping a portion of the bank layer BNL adjacent to an upper side of the light-emitting area EMA. The first electrode contact hole CTD may electrically connect the first electrode RME1 with the first conductive pattern CDP1, so that the first power voltage of the first transistor T1 may be applied to the first electrode RME1 through the first conductive pattern CDP1. The first electrode RME1 may be disconnected after the alignment of the light-emitting elements ED as described above, so that a signal may be applied from the first transistor T1 through the first electrode contact hole CTD thereto. Depending on a structure of the third conductive layer, locations of the first electrode contact holes CTD in different sub-pixels SPXn may be different from each other.

The second electrode RME2 may be electrically connected to the third conductive layer via a second electrode contact hole CTS formed in an area overlapping the bank layer BNL. The second electrode RME2 of the sub-pixel SPXn may be in electrically contact with the second voltage line VL2 as the third conductive layer via the second electrode contact hole CTS extends through the via layer VIA and the protective layer PV overlapping a portion of the bank layer BNL adjacent to the upper side of the light-emitting area EMA. Locations of the second electrode contact holes CTS of different sub-pixels SPXn may be different from each other, based on a structure of the third conductive layer.

The electrodes RME may be electrically connected to the light-emitting element ED. Each of the electrodes RME may be electrically connected to the light-emitting element ED via the connection electrodes CNEs: CNE1, CNE2, and CNE3 which will be described later, and may transmit an electrical signal applied from the conductive layer disposed thereunder to the light-emitting element ED.

Each of the electrodes RME may include a conductive material having a high reflectivity. For example, each of the electrodes RME may include a metal such as silver (Ag), copper (Cu), or aluminum (Al) or an alloy including aluminum (Al), nickel (Ni), lanthanum (La), and the like. Each of the electrodes may reflect light emitted from the light-emitting element ED and traveling to the side faces of the bank patterns BP1 and BP2 toward a top of each sub-pixel SPXn.

However, the disclosure is not limited thereto. Each of the electrodes RME may include a transparent conductive material. For example, each of the electrodes RME may include a material such as ITO (Indium Tin Oxide), IZO (Indium Zinc Oxide), ITZO (Indium Tin-Zinc Oxide), or the like. In some embodiments, each of the electrodes RME may have a structure in which at least one layer made of a transparent conductive material and at least one layer made of a metal having a high reflectivity are stacked each other, or may be composed as a single layer including a transparent conductive material and a metal having a high reflectivity. For example, each of the electrodes RME may have a stack structure such as ITO/silver(Ag)/ITO, ITO/Ag/IZO, or ITO/Ag/ITZO/IZO.

The first insulating layer PAS1 may be disposed on the via layer VIA, the bank patterns BP1 and BP2, and the electrodes RME. The first insulating layer PAS1 may be disposed on the via layer VIA so as to cover the electrodes RME and the bank patterns BP1 and BP2. The first insulating layer PAS1 may not be disposed in the isolation area ROP of the sub-area SA. The first insulating layer PAS1 may protect the electrodes RME and at the same time, may electrically insulate different electrodes RME from each other. The first insulating layer PAS1 may prevent the light-emitting element ED disposed thereon from being damaged due to direct contact with other members. In some embodiments, the first insulating layer PAS1 may be stepped such that a portion of a top face thereof between the electrodes spaced apart from each other in the first direction DR1 is depressed. The light-emitting element ED may be disposed on the depressed portion of the top face of the first insulating layer PAS1 such that a space may be formed between the light-emitting element ED and the first insulating layer PAS1. The second insulating layer PAS2 may fill the space.

The first insulating layer PAS1 may include contacts CT1 and CT2, each exposing a portion of a top face of each of the electrodes RME. The contacts CT1 and CT2 may include a first contact CT1 and a second contact CT2 The contacts CT1 and CT2 may extend through the first insulating layer PAS1, and the first connection electrode CNE1 and the second connection electrode CNE2 which will be described later may electrically contact the exposed electrodes RME through the contacts CT1 and CT2, respectively.

The bank layer BNL may be disposed on the first insulating layer PAS1. The bank layer BNL may be formed in a grid pattern including a portion extending in the first direction DR1 and a portion extending in the second direction DR2 in a plan view. The bank layer BNL may extend along a boundary of each sub-pixel SPXn to distinguish neighboring sub-pixels SPXn from each other. The bank layer BNL may surround the light-emitting area EMA and the sub-area SA. The bank layer BNL may surround and define each of the light-emitting area EMA and the sub-area SA.

The bank layer BNL may have a certain vertical dimension. In some embodiments, a vertical level of a top face of the bank layer BNL may be higher than that of a top face of each of the bank patterns BP1 and BP2. A thickness of the bank layer BNL may be equal to or greater than that of each of the bank patterns BP1 and BP2. However, the disclosure is not limited thereto. A vertical level of a top face of the bank layer BNL may be lower than or equal to that of a top face of each of the bank patterns BP1 and BP2. A thickness of the bank layer BNL may be smaller than that of each of the bank patterns BP1 and BP2. The bank layer BNL may prevent ink of a sub-pixel SPX overflowing into adjacent sub-pixel SPX in the first direction DR1 or overflowing ink of the light-emitting area EMA into the sub-area SA in an inkjet printing process during the manufacturing process of the display device 10. The bank layer BNL may prevent different inks containing different light-emitting elements ED dispersed therein in different sub-pixels SPXn from being mixed with each other. The bank layer BNL may include polyimide as in each of the bank patterns BP1 and BP2. However, the disclosure is not limited thereto.

The light-emitting elements ED may be disposed on the electrodes RME. The light-emitting element ED may include multiple layers arranged in a direction parallel to a top face of the substrate SUB. The light-emitting element ED of the display device 10 may be oriented so that a direction in which the light-emitting element extends is parallel to a top face of the substrate SUB. Multiple semiconductor layers constituting the light-emitting element ED may be sequentially arranged in a direction parallel to the top face of the substrate SUB. The disclosure is not limited thereto. In case that the light-emitting element ED has a different structure, the layers constituting the light-emitting element ED may be arranged in a direction perpendicular to the top face of the substrate SUB.

The light-emitting elements ED may be disposed between the bank patterns BP1 and BP2 or on different electrodes RME. Some of the light-emitting elements ED may be disposed between a first bank pattern BP1 and the second bank pattern BP2, while the other thereof may be disposed between another first bank pattern BP1 and the second bank pattern BP2. According to an embodiment, the light-emitting elements ED may include a first light-emitting element ED1 disposed between the first bank pattern BP1 disposed at the right side of the center of the light-emitting area EMA and the second bank pattern BP2, and a second light-emitting element ED2 disposed between the second bank pattern BP2 and the first bank pattern BP1 disposed at the left side of the center of the light-emitting area EMA.

The first light-emitting element ED1 may be disposed on the first electrode RME1 and the third electrode RME3, and the second light-emitting element ED2 may be disposed on the first electrode RME1 and the second electrode RME2. The first light-emitting element ED1 may be disposed on a right side of the light-emitting area EMA of the corresponding sub-pixel SPXn. The second light-emitting element ED2 may be disposed on a left side of the light-emitting area EMA of the corresponding sub-pixel SPX. Each of the light-emitting elements ED may be identified not based on a position thereof in the light-emitting area EMA, but based on a connection relationship with the connection electrode CNE, which will be described later. Both ends of each of the light-emitting elements ED may respectively electrically contact different connection electrodes CNE depending on an arrangement structure of the connection electrodes CNE. Different light-emitting elements ED may electrically contact different types of connection electrodes CNE.

The light-emitting elements ED may electrically contact and be electrically connected to the connection electrodes CNE1, CNE2, and CNE3. Since each portion of the semiconductor layer at ends of the light-emitting element ED in a direction in which the light-emitting element ED extends are exposed, the exposed portion of the semiconductor layer may electrically contact the connection electrodes CNE. An end of the first light-emitting element ED1 may electrically contact the first connection electrode CNE1 and another end thereof may electrically contact the third connection electrode CNE3. An end of the second light-emitting element ED2 may electrically contact the second connection electrode CNE2 and another end thereof may electrically contact the third connection electrode CNE3. Each of the light-emitting elements ED may be electrically connected to the conductive layers under the electrode RME and the via layer VIA via the connection electrode CNEs, and the electric signal may be applied to the element ED to emit light in a specific wavelength band.

The second insulating layer PAS2 may be disposed on the light-emitting elements ED and the first insulating layer PAS1. The second insulating layer PAS2 may include a pattern portion which is disposed between the bank patterns BP1 and BP2, extends in the second direction DR2, and is disposed on the light-emitting elements ED. The pattern portion may be disposed to partially surround an outer surface of the light-emitting element ED, and both opposing sides or both opposing ends of the light-emitting element ED may not be covered with the pattern portion. The pattern portion may be formed in a linear or island-shaped pattern in a plan view and mat be disposed in each sub-pixel SPXn. The pattern portion of the second insulating layer PAS2 may protect the light-emitting elements ED and at the same time, fix the light-emitting elements ED in the manufacturing process of the display device 10.

The second insulating layer PAS2 may fill a space between the light-emitting element ED and the first insulating layer PAS1. For example, the second insulating layer PAS2 may be formed to cover an entirety of each of the light-emitting elements ED and patterned such that both opposing ends of each of the light-emitting elements ED may be exposed. The second insulating layer PAS2 may have a portion which fill the space between each of the emitting elements ED and the first insulating layer PAS1 thereunder.

The connection electrodes CNE1, CNE2, and CNE3 may include a first connection electrode CNE1 and a second connection electrode CNE2 as first type connection electrodes, and a third connection electrode CNE3 as a second type connection electrode.

The first connection electrode CNE1 may have a shape extending in the second direction DR2 and may be disposed on the first electrode RME1. A portion of the first connection electrode CNE1 disposed on the second bank pattern BP2 may overlap the first electrode RME1. The first connection electrode CNE1 may extend from the portion in the second direction DR2, and extend over the bank layer BNL into the sub-area SA adjacent to the upper side of the light-emitting area EMA. The first connection electrode CNE1 may be electrically connected to at least one of the first electrode RME1 and the first conductive pattern CDP1 via the first contact CT1.

The second connection electrode CNE2 may have a shape extending in the second direction DR2 and may be disposed on the second electrode RME2. A portion of the second connection electrode CNE2 disposed on the first bank pattern BP1 may overlap the second electrode RME2. The second connection electrode CNE2 may extend from the portion in the second direction DR2, and extend over the bank layer BNL into the sub-area SA adjacent to the upper side of the light-emitting area EMA. The second connection electrode CNE2 may electrically contact the second voltage line VL2 via the second contact CT2.

The first connection electrode CNE1 may be disposed adjacent to the second connection electrode CNE2 and the third connection electrode CNE3 may be interposed therebetween. The first connection electrode CNE1 and the second connection electrode CNE2 may extend in a parallel manner to each other (or extend generally in a direction) and may be disposed in the light-emitting area EMA and the sub-area SA.

The third connection electrode CNE3 may be disposed to overlap the first electrode RME1 and the third electrode RME3. For example, the third connection electrode CNE3 may include third extensions CN_E1 and CN_E2 extending in the second direction DR2, and a first connection portion CN_B1 connecting the third extensions CN_E1 and CN_E2 to each other. The third extensions may include the first-third extension CN_E1 and the second-third extension CN_E2. The first-third extension CN_E1 may be disposed on the third electrode RME3, and the second-third extension CN_E2 may be disposed on the first electrode RME1. The first connection portion CN_B1 may extend in the first direction DR1 and may be disposed on a portion of the bank layer BNL adjacent to a lower side of the light-emitting area EMA connecting the first-third extension CN_E1 and the second-third extension CN_E2 to each other. The third connection electrode CNE3 may be disposed on the light-emitting area EMA and the bank layer BNL, and may not be electrically connected to the third electrode RME3. The third connection electrode CNE3 may be in a floating state in which the third connection electrode CNE3 is not connected to other lines or electrodes. The third connection electrode CNE3 may transmit a signal applied via the light-emitting elements ED. The first light-emitting element ED1 and the second light-emitting element ED2 may be electrically connected in series to each other via the third connection electrode CNE3.

The third insulating layer PAS3 may be disposed on the third connection electrode CNE3, the first insulating layer PAS1, and the second insulating layer PAS2. The third insulating layer PAS3 may be disposed to cover the third connection electrode CNE3 so as to electrically insulate the third connection electrode CNE3 from the first connection electrode CNE1 and the second connection electrode CNE2 adjacent thereto. The first connection electrode CNE1 and the second connection electrode CNE2 may be disposed on the third insulating layer PAS3.

Although not shown in the drawing, an additional insulating layer may be disposed on the third insulating layer PAS3, the first connection electrode CNE1, and the second connection electrode CNE2. The additional insulating layer may serve to protect the members disposed on the substrate SUB from the external environment. Each of the first insulating layer PAS1, the second insulating layer PAS2, and the third insulating layer PAS3 may include an inorganic insulating material or an organic insulating material.

Figure 6:
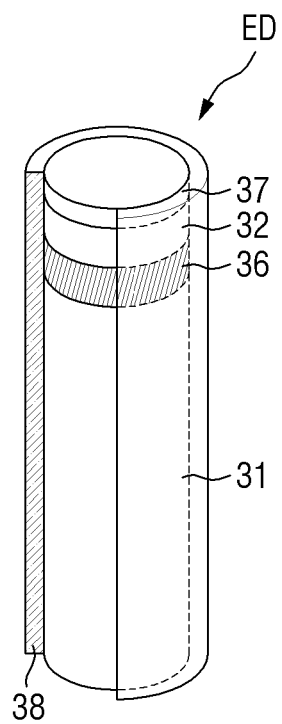
FIG. 6 is a perspective view showing a light-emitting element according to an embodiment.

FIG. 6 is a perspective view showing a light-emitting element according to an embodiment.

Referring to FIG. 6, the light-emitting element ED may be embodied as a light-emitting diode. For example, the light-emitting element ED may be embodied as an inorganic light-emitting diode made of an inorganic material having a size of nano-meter to micro-meter. The light-emitting elements ED may be arranged between two electrodes RME facing each other. In case that an electric field in a specific direction is generated between the electrodes RME, the light-emitting elements ED may be aligned in the same orientation.

The light-emitting element ED according to an embodiment may have a shape extending in a direction. The light-emitting element ED may have a shape such as a cylinder, a rod, a wire, or a tube. However, the shape of the light-emitting element ED is not limited thereto. The light-emitting element ED may have a variety of shapes. In another embodiment, the light-emitting element ED may have a shape of a polygonal prism such as a cube, a cuboid, or a hexagonal prism. In still another embodiment, the light-emitting element may extend in a direction and has a partially inclined outer face.

The light-emitting element ED may include a semiconductor layer doped with a conductive type, for example, p-type or n-type impurities. The semiconductor layer may receive an electrical signal applied from an external power source and may emit light of a specific wavelength band. The light-emitting element ED may include a first semiconductor layer 31, a second semiconductor layer 32, a light-emitting layer 36, an electrode layer 37, and an insulating film 38.

The first semiconductor layer 31 may be an n-type semiconductor. The first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer 31 may be made of at least one of AlGaInN, GaN, AlGaN, InGaN, AlN, and InN and may be doped with a n-type dopant. The n-type dopant doped into the first semiconductor layer 31 may be Si, Ge, Sn, or the like.

The second semiconductor layer 32 may be disposed on the first semiconductor layer 31 while the light-emitting layer 36 is interposed therebetween. The second semiconductor layer 32 may be a p-type semiconductor. The second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 32 may be made of at least one of AlGaInN, GaN, AlGaN, InGaN, AlN, and InN and may be doped with a p-type dopant. The p-type dopant doped into the second semiconductor layer 32 may be Mg, Zn, Ca, Se, Ba, or the like.

The drawing shows that each of the first semiconductor layer 31 and the second semiconductor layer 32 is composed of a single layer. However, the disclosure is not limited thereto. Depending on a material of the light-emitting layer 36, each of the first semiconductor layer 31 and the second semiconductor layer 32 may include a larger number of layers, for example, a cladding layer or a TSBR (tensile strain barrier reducing) layer.

The light-emitting layer 36 may be disposed between the first semiconductor layer 31 and the second semiconductor layer 32. The light-emitting layer 36 may include a single or multiple quantum well structure. In case that the light-emitting layer 36 includes a multiple quantum well structure, the light-emitting layer 36 may have a structure in which multiple quantum layers and multiple well layers are alternately stacked with each other. The light-emitting layer 36 may emit light via combinations of electrons and holes in response to an electrical signal applied through the first semiconductor layer 31 and the second semiconductor layer 32. The light-emitting layer 36 may include a material such as AlGaN and AlGaInN. For example, in case that the light-emitting layer 36 has a structure in which multiple quantum layers and multiple well layers are alternately stacked with each other, the quantum layer may include a material such as AlGaN or AlGaInN, and the well layer may include a material such as GaN or AlInN.

The light-emitting layer 36 may have a structure in which multiple first layers made of a semiconductor material having a larger bandgap energy and multiple second layers made of a semiconductor material having a smaller bandgap energy are alternately stacked with each other. The light-emitting layer 36 may include group III to group V semiconductor materials depending on a wavelength band of emitting light. The light emitted from the light-emitting layer 36 is not limited to light of a wavelength band corresponding to a blue color. In another embodiment, the light emitted from the light-emitting layer 36 may be light of a wavelength band corresponding to a red or green color.

The electrode layer 37 may be embodied as an ohmic connection electrode. The disclosure is not limited thereto. The electrode layer 37 may be embodied as a Schottky connection electrode. The light-emitting element ED may include at least one electrode layer 37. The disclosure is not limited thereto. The electrode layer 37 may be omitted.

The electrode layer 37 may reduce an electrical resistance between the light-emitting element ED and the electrode or the connection electrode in case that the light-emitting element ED is electrically connected to the electrode or the connection electrode in the display device 10. The electrode layer 37 may include a conductive metal. For example, the electrode layer 37 may include at least one of aluminum (Al), titanium (Ti), indium (In), gold (Au), silver, (Ag), ITO, IZO, and ITZO.

The insulating film 38 may be disposed to surround an outer face of each of the semiconductor layers 31 and 32, the light-emitting layer 36, and the electrode layer 37. For example, the insulating film 38 may be disposed to surround at least an outer face of the light-emitting layer 36 such that both opposing ends in a longitudinal direction of the light-emitting element ED is exposed. The insulating film 38 may be formed in an area adjacent to at least an end of the light-emitting element ED to have a rounded top face in a cross-sectional view.

The insulating film 38 may include a material having an insulating ability, for example, silicon oxide ($SiO_x$), silicon nitride ($SiN_x$), silicon oxynitride ($SiO_xN_y$), aluminum nitride ($AlN_x$), aluminum oxide ($AlO_x$), and the like. The drawing illustrates that the insulating film 38 is formed as a single layer. However, the disclosure is not limited thereto. In some embodiments, the insulating film 38 may be embodied as a multiple layer structure in which multiple layers are stacked each other.

The insulating film 38 may perform the function of protecting the members. The insulating film 38 may prevent an electrical short circuit that may otherwise occur in the light-emitting layer 36 in case that the light-emitting element ED is in direct contact with the electrode to which the electrical signal is transmitted. The insulating film 38 may prevent deterioration of the luminous efficiency of the light-emitting element ED.

An outer face of the insulating film 38 may be surface-treated. The light-emitting elements ED may be sprayed onto the electrode while being dispersed in an ink and may be aligned with each other. In order to prevent adjacent light-emitting elements ED from being aggregated with each other and keep the light-emitting elements ED in a dispersed state in the ink, a surface of the insulating film 38 may be treated to have hydrophobicity or hydrophilicity.

Figure 7:
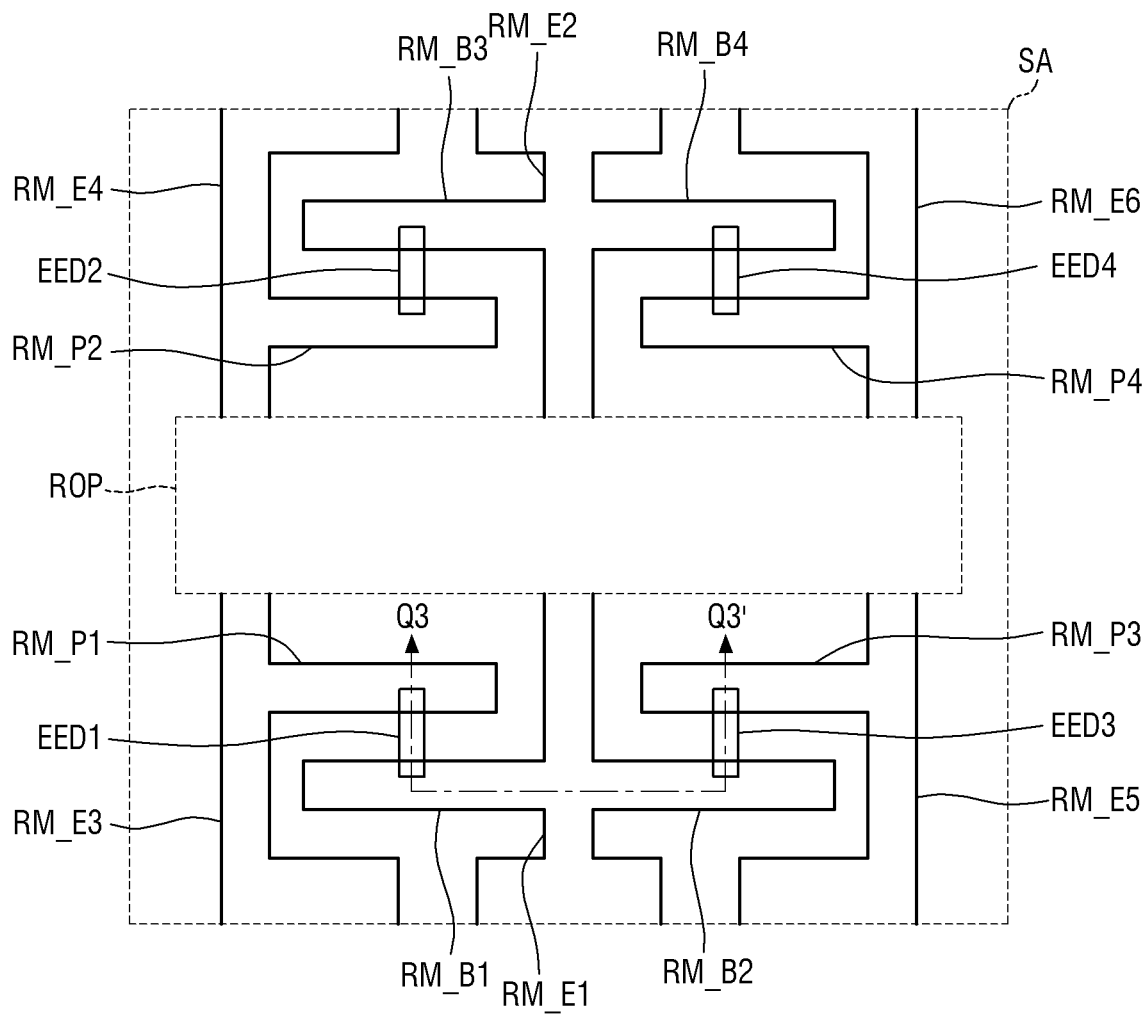
FIG. 7 is a plan view showing a sub-area of one sub-pixel of a display device according to an embodiment.
Figure 8:
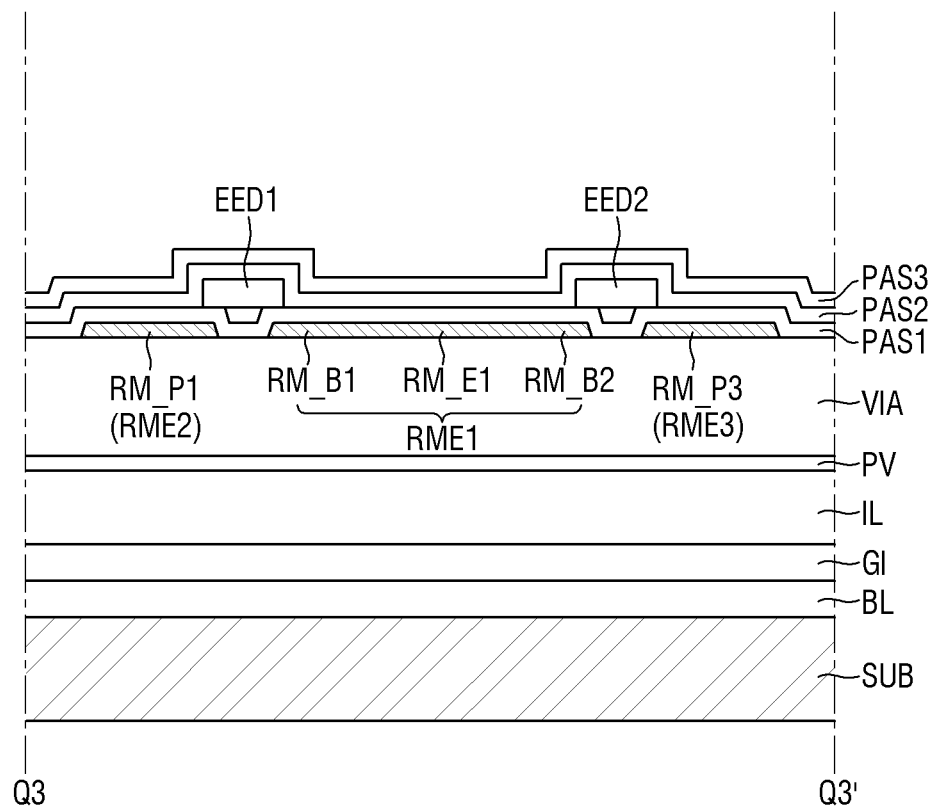
FIG. 8 is a schematic cross-sectional view taken along line Q3-Q3' in FIG. 7.
Figure 9:
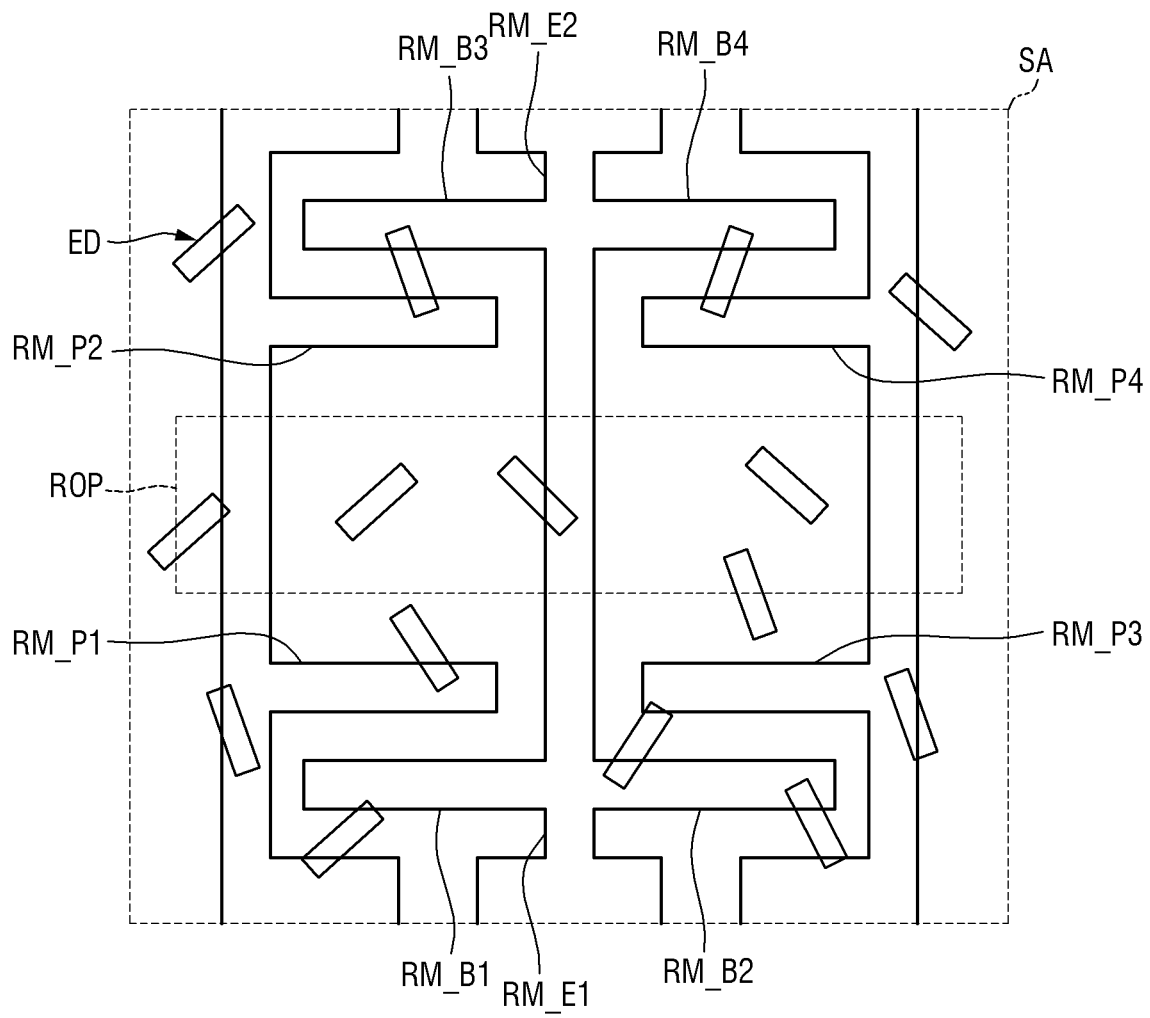
FIG. 9 is a plan view schematically showing a state in which ink is applied to a sub-area of one sub-pixel.
Figure 9:
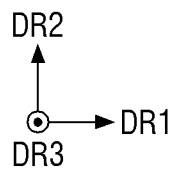
Figure 10:
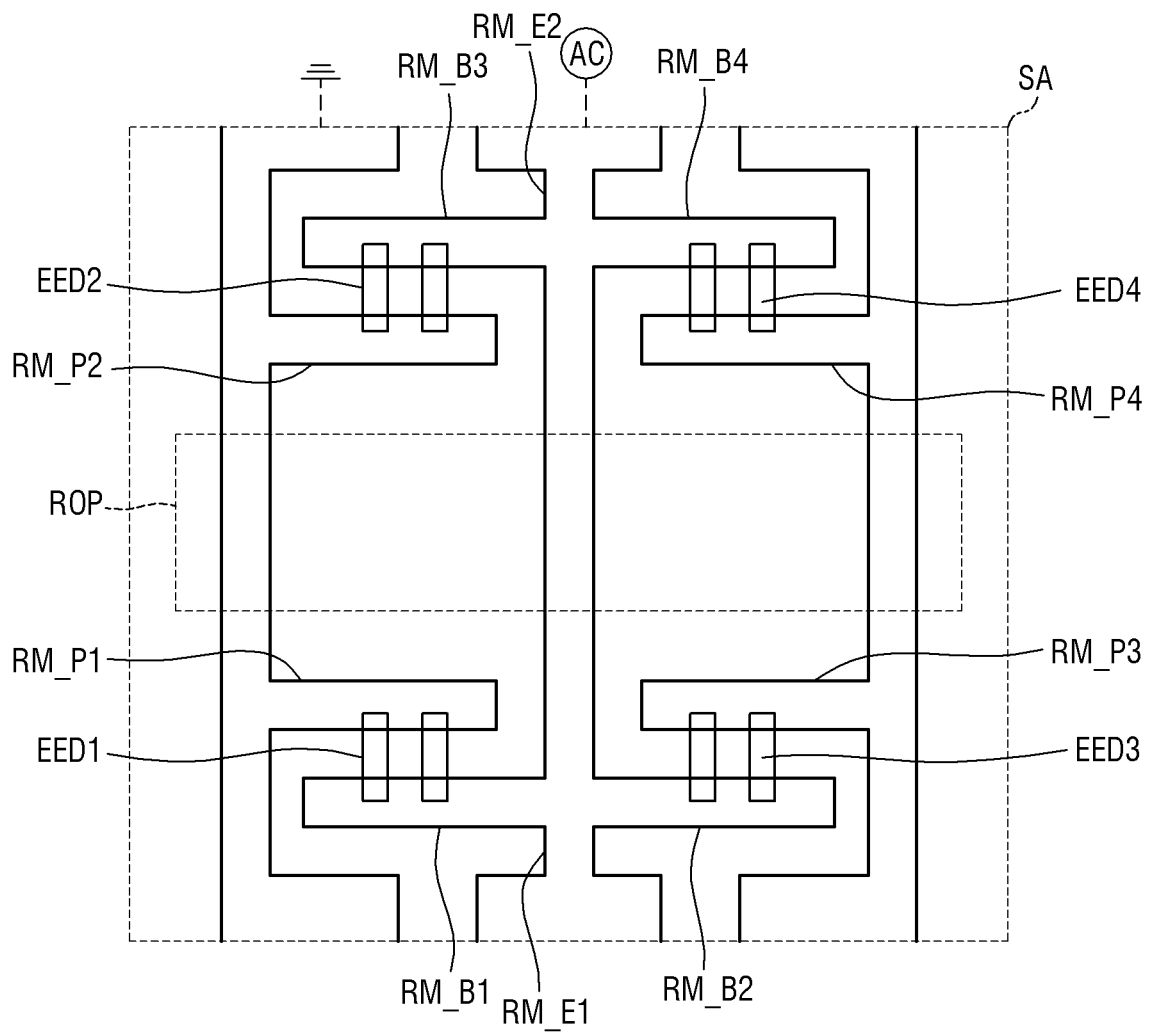
FIG. 10 is a plan view schematically showing a state in which an alignment signal has been applied to a sub-area of one sub-pixel.

FIG. 7 is a plan view showing a sub-area of one sub-pixel of a display device according to an embodiment. FIG. 8 is a cross-sectional view taken along line Q3-Q3' in FIG. 7. FIG. 9 is a plan view schematically showing a state in which ink is applied to a sub-area of one sub-pixel. FIG. 10 is a plan view schematically showing a state in which an alignment signal has been applied to a sub-area of one sub-pixel.

Referring to FIG. 7 and FIG. 8, the sub-pixel SPXn according to an embodiment may include the sub-area SA. As described above, the first electrode RME1, the second electrode RME2, and the third electrode RME3 may extend from the light-emitting area to the sub-area SA. Each of the first electrode RME1, the second electrode RME2, and the third electrode RME3 may be discontinuous in the isolation area ROP and may be divided into portions spaced apart from each other. For example, each of the first electrode RME1, the second electrode RME2, and the third electrode RME3 may be divided into portions which may be spaced apart from each other in the second direction DR2 while the isolation area ROP is disposed between the portions.

The first electrode RME1 may include stems RM_E1 and RM_E2 extending in the second direction DR2, and branches RM_B1 and RM_B2 branched from the stem RM_E1, and branches RM_B3, and RM_B4 branched from the stem RM_E2.

The stems RM_E1 and RM_E2 may include a first stem RM_E1 and a second stem RM_E2 spaced apart from each other while the isolation area ROP is interposed therebetween. The first stem RM_E1 may refer to a portion of the first electrode RME1 which extends in the second direction DR2 from the light-emitting area and which a width thereof is relatively small. However, the disclosure is not limited thereto, and the width of the first stem RM_E1 may be equal to a width of the first electrode RME1 in the light-emitting area EMA. For example, the first stem RM_E1 may be a portion of the first electrode RME1 extending from a lower side of the sub-area SA to the sub-area SA in the second direction DR2 in a plan view. The second stem RM_E2 may refer to a portion of the first electrode RME1 which extends in the opposite direction to the second direction DR2 and which a width thereof is relatively small. However, the disclosure is not limited thereto, and the width of the second stem RM_E2 may be equal to a width of the first electrode RME1 in the light-emitting area EMA. For example, the second stem RM_E2 may be a portion of the first electrode RME1 extending from an upper side of the sub-area SA in the direction opposite to the second direction DR2 to the sub-area SA in a plan view. The widths of the first stem RM_E1 and the second stem RM_E2 in the first direction DR1 may be equal to each other. However, the disclosure is not limited thereto. For example, the width of the first stem RM_E1 may be greater or smaller than the width of the second stem RM_E2.

The branches RM_B1, RM_B2, RM_B3, and RM_B4 may include the first branch RM_B1 and the second branch RM_B2 branched from the first stem RM_E1, and the third branch RM_B3 and the fourth branch RM_B4 branched from the second stem RM_E2.

The first branch RM_B1 may branch from the first stem RM_E1 in a direction opposite to the first direction DR1. The first branch RM_B1 may extend toward the second electrode RME2 adjacent thereto and be spaced apart from the second electrode RME2. A width of the first branch RM_B1 may be equal to a width of the first stem RM_E1. However, the disclosure is not limited thereto, and the width of the first branch RM_B1 may be smaller than the width of the first stem RM_E1. The second branch RM_B2 may branch from the first stem RM_E1 in the first direction DR1. The second branch RM_B2 may extend toward the third electrode RME3 adjacent thereto and be spaced apart from the third electrode RME3. A width of the second branch RM_B2 may be equal to a width of the first stem RM_E1. However, the disclosure is not limited thereto, and the width of the second branch RM_B2 may be smaller than the width of the first stem RM_E1. The first branch RM_B1 and the second branch RM_B2 may be symmetrical with each other with respect to the first stem RM_E1. For example, a length of the first branch RM_B1 and a length of the second branch RM_B2 may be equal to each other, and the width of the first branch RM_B1 and the width of the second branch RM_B2 may be equal to each other. However, the disclosure is not limited thereto, and the first branch RM_B1 and the second branch RM_B2 may be asymmetric with each other with respect to the first stem RM_E1.

The third branch RM_B3 may branch from the second stem RM_E2 in a direction opposite to the first direction DR1. The third branch RM_B3 may extend toward the second electrode RME2 adjacent thereto and be spaced apart from the second electrode RME2. A width of the third branch RM_B3 may be equal to the width of the second stem RM_E2. However, the disclosure is not limited thereto, and the width of the third branch RM_B3 may be smaller than the width of the second stem RM_E2. The fourth branch RM_B4 may branch from the second stem RM_E2 in the first direction DR1. The fourth branch RM_B4 may extend toward the third electrode RME3 adjacent thereto and be spaced apart from the third electrode RME3. The width of the fourth branch RM_B4 may be equal to the width of the second stem RM_E2. However, the disclosure is not limited thereto, and the width of the fourth branch RM_B4 may be smaller than the width of the second stem RM_E2. The third branch RM_B3 and the fourth branch RM_B4 may be symmetrical with each other with respect to the second stem RM_E2. For example, a length of the third branch RM_B3 and a length of the fourth branch RM_B4 may be equal to each other, and the width of the third branch RM_B3 and the width of the fourth branch RM_B4 may be equal to each other. However, the disclosure is not limited thereto, and the third branch RM_B3 and the fourth branch RM_B4 may be asymmetric with each other with respect to the second stem RM_E2.

The first branch RM_B1 and the third branch RM_B3 may be symmetrical with each other with respect to the isolation area ROP. For example, the length of the first branch RM_B1 and the length of the third branch RM_B3 may be equal to each other, and the width of the first branch RM_B1 and the width of the third branch RM_B3 may be equal to each other. However, the disclosure is not limited thereto, and the first branch RM_B1 and the third branch RM_B3 may be asymmetric with each other with respect to the isolation area ROP. The second branch RM_B2 and the fourth branch RM_B4 may be symmetrical with each other with respect to the isolation area ROP. For example, the length of the second branch RM_B2 and the length of the fourth branch RM_B4 may be equal to each other, and the width of the second branch RM_B2 and the width of the fourth branch RM_B4 may be equal to each other. However, the disclosure is not limited thereto, and the second branch RM_B2 and the fourth branch RM_B4 may be asymmetric with each other with respect to the isolation area ROP. A planar shape of each of the branches RM_B1, RM_B2, RM_B3, and RM_B4 may be a rectangular shape having a long side extending in the first direction DR1. However, the disclosure is not limited thereto.

The second electrode RME2 may include a third stem RM_E3 and a fourth stem RM_E4 extending in the second direction DR2, a first protrusion RM_P1 protruding from the third stem RM_E3, and a second protrusion RM_P2 protruding from the fourth stem RM_E4.

The third stem RM_E3 and the fourth stem RM_E4 may be spaced apart from each other while the isolation area ROP is interposed therebetween. The third stem RM_E3 may refer to a portion of the second electrode RME2 which extends in the second direction DR2 and which a width thereof is relatively small. However, the disclosure is not limited thereto, and the width of the third stem RM_E3 may be equal to the width of a portion of the second electrode RME2 in the light-emitting area EMA. For example, the third stem RM_E3 may be a portion of the second electrode RME2 extending from the lower side of the sub-area SA in the second direction DR2 into the sub-area SA in a plan view. The fourth stem RM_E4 may refer to a portion of the second electrode RME2 which extends in the opposite direction to the second direction DR2 and which a width thereof is relatively small. However, the disclosure is not limited thereto, and the width of the fourth stem RM_E4 may be equal to the width of a portion of the second electrode RME2 in the light-emitting area EMA. For example, the fourth stem RM_E4 may be a portion of the second electrode RME2 extending from the upper side of the sub-area SA in a direction opposite to the second direction DR2 into the sub-area SA in a plan view. Widths of the third stem RM_E3 and the fourth stem RM_E4 in the first direction DR1 may be equal to each other. However, the disclosure is not limited thereto. For example, the width of the third stem RM_E3 may be larger or smaller than the width of the fourth stem RM_E4.

The first protrusion RM_P1 may protrude from the third stem RM_E3 in the first direction DR1. The first protrusion RM_P1 may extend toward the first electrode RME1 adjacent thereto and be spaced apart from the first electrode RME1. A width of the first protrusion RM_P1 may be equal to the width of the third stem RM_E3. However, the disclosure is not limited thereto, and the width of the first protrusion RM_P1 may be smaller than the width of the third stem RM_E3. The first protrusion RM_P1 may be disposed adjacent to and extend in a parallel manner to the first branch RM_B1, and may face the first branch RM_B1. The first protrusion RM_P1 and the first branch RM_B1 may act as alignment electrodes to which an alignment signal may be applied such that a dummy light-emitting element disposed therebetween may be aligned.

The second protrusion RM_P2 may protrude from the fourth stem RM_E4 in the first direction DR1. The second protrusion RM_P2 may extend toward the first electrode RME1 adjacent thereto and be spaced apart from the first electrode RME1. A width of the second protrusion RM_P2 may be equal to the width of the fourth stem RM_E4. However, the disclosure is not limited thereto, and the width of the second protrusion RM_P2 may be smaller than the width of the fourth stem RM_E4. The second protrusion RM_P2 may be disposed adjacent to and extend in a parallel manner to the third branch RM_B3, and may face the third branch RM_B3. The second protrusion RM_P2 and the third branch RM_B3 may act as alignment electrodes to which an alignment signal may be applied such that a dummy light-emitting element disposed therebetween may be aligned.

The third electrode RME3 may include a fifth stem RM_E5 and a sixth stem RM_E6 extending in the second direction DR2, a third protrusion RM_P3 protruding from the fifth stem RM_E5, and a fourth protrusion RM_P4 protruding from the sixth stem RM_E6.

The fifth stem RM_E5 and the sixth stem RM_E6 may be spaced apart from each other while the isolation area ROP id disposed therebetween. The fifth stem RM_E5 may refer to a portion of the third electrode RME3 which extends in the second direction DR2, and which a width thereof is relatively small. However, the disclosure is not limited thereto, and the width of the fifth stem RM_E5 may be equal to the width of a portion of the third electrode RME3 in the light-emitting area EMA. For example, the fifth stem RM_E5 may be a portion of the third electrode RME3 extending from the lower side of the sub-area SA in the second direction DR2 into the sub-area SA in a plan view. The sixth stem RM_E6 may refer to a portion of the third electrode RME3 which extends in the opposite direction to the second direction DR2, and which a width thereof is relatively small. However, the disclosure is not limited thereto, and the width of the sixth stem RM_E6 may be equal to the width of a portion of the third electrode RME3 in the light-emitting area EMA. For example, the sixth stem RM_E6 may be a portion of the third electrode RME3 extending in a direction opposite to the second direction DR2 from the upper side of the sub-area SA into the sub-area SA in a plan view. The widths in the first direction DR1 of the fifth stem RM_E5 and the sixth stem RM_E6 may be equal to each other. However, the disclosure is not limited thereto. For example, the width of the fifth stem RM_E5 may be greater or smaller than the width of the sixth stem RM_E6.

The third protrusion RM_P3 may protrude from the fifth stem RM_E5 in a direction opposite to the first direction DR1. The third protrusion RM_P3 may extend toward the first electrode RME1 adjacent thereto and may be disposed to be spaced apart from the first electrode RME1. A width of the third protrusion RM_P3 may be equal to the width of the fifth stem RM_E5. However, the disclosure is not limited thereto, and the width of the third protrusion RM_P3 may be smaller than the width of the fifth stem RM_E5. The third protrusion RM_P3 may be disposed adjacent to and extend in a parallel manner to the second branch RM_B2, and may face the second branch RM_B2. The third protrusion RM_P3 and the third branch RM_B3 may act as alignment electrodes to which an alignment signal may be applied such that a dummy light-emitting element disposed therebetween may be aligned.

The fourth protrusion RM_P4 may protrude from the sixth stem RM_E6 in a direction opposite to the first direction DR1. The fourth protrusion RM_P4 may extend toward the first electrode RME1 adjacent thereto and be spaced apart from the first electrode RME1. A width of the fourth protrusion RM_P4 may be equal to the width of the sixth stem RM_E6. However, the disclosure is not limited thereto, and the width of the fourth protrusion RM_P4 may be smaller than the width of the sixth stem RM_E6. The fourth protrusion RM_P4 may be disposed to be adjacent to and parallel to the fourth branch RM_B4, and may be disposed to face the fourth branch RM_B4. The fourth protrusion RM_P4 and the fourth branch RM_B4 may act as alignment electrodes to which an alignment signal may be applied such that a dummy light-emitting element disposed therebetween may be aligned.

The first protrusion RM_P1 and the third protrusion RM_P3 may be symmetrical with each other with respect to the first stem RM_E1. For example, a length of the first protrusion RM_P1 and a length of the third protrusion RM_P3 may be equal to each other, and the width of the first protrusion RM_P1 and the width of the third protrusion RM_P3 may be equal to each other. However, the disclosure is not limited thereto, and the first protrusion RM_P1 and the third protrusion RM_P3 may be asymmetric with each other with respect to the first stem RM_E1. The second protrusion RM_P2 and the fourth protrusion RM_P4 may be symmetrical with each other with respect to the second stem RM_E2. For example, a length of the second protrusion RM_P2 and a length of the fourth protrusion RM_P4 may be equal to each other, and the width of the second protrusion RM_P2 and the width of the fourth protrusion RM_P4 may be equal to each other. However, the disclosure is not limited thereto, and the second protrusion RM_P2 and the fourth protrusion RM_P4 may be asymmetric with each other with respect to the second stem RM_E2.

As described above, each of dummy light-emitting elements EED may be disposed on each of the branches RM_B1, RM_B2, RM_B3, and RM_B4 and on each of the protrusions RM_P1, RM_P2, RM_P3, and RM_P4. The dummy light-emitting elements EED may be offset from the isolation area ROP of the sub-area SA. For example, the dummy light-emitting elements EED may not be disposed in the isolation area ROP.

Specifically, a first dummy light-emitting element EED1 may be disposed on the first branch RM_B1 of the first electrode RME1 and the first protrusion RM_P1 of the second electrode RME2. A second dummy light-emitting element EED2 may be disposed on the third branch RM_B3 of the first electrode RME1 and the second protrusion RM_P2 of the second electrode RME2. A third dummy light-emitting element EED3 may be disposed on the second branch RM_B2 of the first electrode RME1 and the third protrusion RM_P3 of the third electrode RME3. A fourth dummy light-emitting element EED4 may be disposed on the fourth branch RM_B4 of the first electrode RME1 and the fourth protrusion RM_P4 of the third electrode RME3.

The first insulating layer PAS1 may be disposed on the first electrode RME1, the second electrode RME2, and the third electrode RME3. Each of the dummy light-emitting elements EED may be disposed on the first insulating layer PAS1. Each of the dummy light-emitting elements EED may be disposed directly on the first insulating layer PAS1, and may be disposed on each of the electrodes RME.

The second insulating layer PAS2 may be disposed on each of the dummy light-emitting elements EED and the first insulating layer PAS1. The second insulating layer PAS2 may cover each of the dummy light-emitting elements EED and may directly contact a top face and sides thereof. Therefore, each of the dummy light-emitting elements EED may be completely covered with the second insulating layer PAS2 and may not contact any electrodes. For example, no connection electrode CNE may be disposed on a top face of each of the dummy light-emitting elements EED. For example, the dummy light-emitting elements EED may be non-light-emitting elements that do not emit light because they are not electrically connected to the connection electrodes CNE.

The third insulating layer PAS3 may be disposed on the second insulating layer PAS2. The third insulating layer PAS3 may cover the second insulating layer PAS2.

The manufacturing process of the display device 10 may include spraying ink containing the light-emitting elements ED onto the light-emitting area EMA of each sub-pixel SPXn, and applying an alignment signal to each of the electrodes RME such that the light-emitting elements ED may be disposed on the electrodes RME. However, in case that an amount of the ink is large or an error related to an ejection position occurs, the ink may overflow into the sub-area SA. In case that the ink is present in the sub-area SA, the electrodes RME may be not reliably isolated from each other in the isolation area ROP, and thus turn on/off failure may occur.

In an embodiment, even in case that the ink containing the light-emitting elements ED overflows into the sub-area SA, the alignment signal may be applied to each of the electrodes RME to move the light-emitting elements ED into an area other than the isolation area ROP of the sub-area SA and align the light-emitting elements ED, thereby avoiding defects.

Referring to FIG. 9 and FIG. 10, in case that the ink containing the light-emitting elements ED is ejected, the ink may partially overflow into the sub-area SA and thus the ink may be disposed in an entirety of the sub-area SA. The light-emitting elements ED may be randomly distributed, and may be disposed on each of the electrodes RME and in the isolation area ROP in which the electrodes RME are isolated from each other.

As shown in FIG. 10, in case that the alignment signal is applied to each of the electrodes RME, an electric field may be generated on each of the electrodes RME. Thus, the light-emitting elements ED dispersed in the ink may be subjected to dielectrophoretic force under the electric field. Thus, orientations and positions thereof may be changed and thus the elements ED may be disposed on the electrodes RME.

For example, in case that an electric field is generated on the first electrode RME1, the second electrode RME2, and the third electrode RME3, the light-emitting elements ED may move from an initial dispersed position toward a place where the strong electric field occurs, under the dielectrophoretic force. An area having the strong electric field in the sub-area SA may be an area having the shortest distance between adjacent ones of the first electrode RME1, the second electrode RME2, and the third electrode RME3. For example, the area having the strong electric field may include an area between the first branch RM_B1 and the first protrusion RM_P1, an area between the third branch RM_B3 and the second protrusion RM_P2, an area between the second branch RM_B2 and the third protrusion RM_P3, and an area between the fourth branch RM_B4 and the fourth protrusion RM_P4. Accordingly, a first dummy light-emitting element EED1 may be disposed between the first branch RM_B1 and the first protrusion RM_P1, a second dummy light-emitting element EED2 may be disposed between the third branch RM_B3 and the second protrusion RM_P2, a third dummy light-emitting element EED3 may be disposed between the second branch RM_B2 and the third protrusion RM_P3, and a fourth dummy light-emitting element EED4 may be disposed between the fourth branch RM_B4 and the fourth protrusion RM_P4.

In the isolation area ROP, a distance between the electrodes RME may be the largest, so that relatively weak electric field may be generated. Accordingly, the light-emitting elements may be not disposed on the isolation area ROP, such that a subsequent isolation process of the electrodes RME from each other may be well performed, thereby preventing a defect from occurring.

Hereinafter, display devices according to other embodiments will be described.

Figure 11:
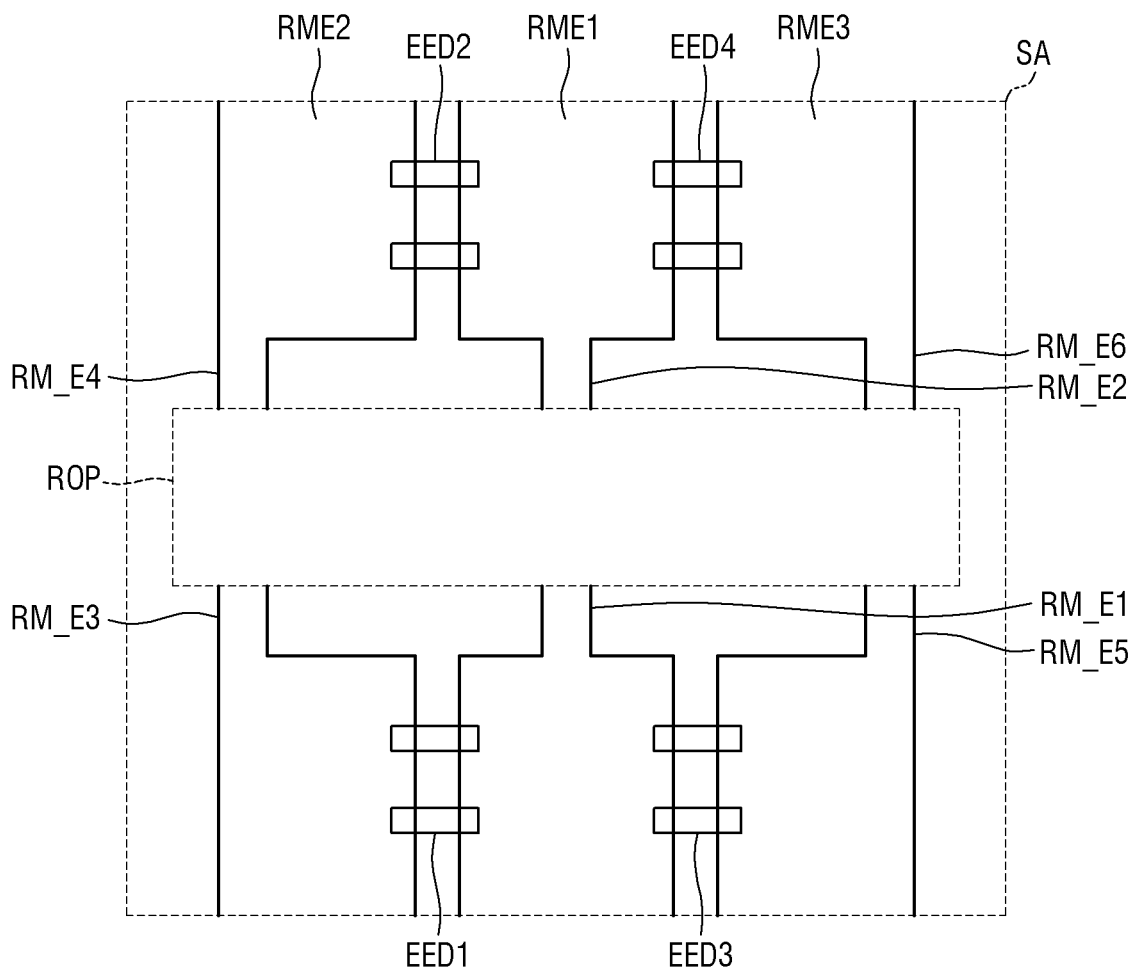
FIG. 11 is a plan view showing a sub-area of one sub-pixel of a display device according to another embodiment.

FIG. 11 is a plan view showing a sub-area of one sub-pixel of a display device according to another embodiment.

Referring to FIG. 11, this embodiment is different from the embodiment of FIG. 3 to FIG. 10 in that the branches of the first electrode RME1 are omitted, and the protrusions of the second electrode RME2 and the third electrode RME3 are omitted. Hereinafter, descriptions duplicate with those of the above-described embodiments will be omitted and following descriptions will be based on differences therebetween.

As described above, the first electrode RME1, the second electrode RME2, and the third electrode RME3 may extend from the light-emitting area to the sub-area SA. Each of the first electrode RME1, the second electrode RME2, and the third electrode RME3 may be disconnected in the isolation area ROP and may be divided into portions spaced apart from each other by the isolation area ROP.

The first electrode RME1 may include a first stem RM_E1 and a second stem RM_E2 spaced apart from each other while the isolation area ROP is interposed therebetween. Each of the first stem RM_E1 and the second stem RM_E2 may be a portion of the first electrode RME1 having a relatively smaller width than that of a portion of the first electrode RME1 in the light-emitting area EMA in FIG. 3. For example, a width of each of the first stem RM_E1 and the second stem RM_E2 may be smaller than a width of the first electrode RME1 disposed in the light-emitting area EMA. The second electrode RME2 may include a third stem RM_E3 and a fourth stem RM_E4 spaced apart from each other while the isolation area ROP is interposed therebetween. The third electrode RME3 may include a fifth stem RM_E5 and a sixth stem RM_E6 spaced apart from each other while the isolation area ROP is interposed therebetween. Each of the third stem RM_E3 and the fourth stem RM_E4 may have a width smaller than a width of the second electrode RME2 disposed in the light-emitting area EMA. Further, each of the fifth stem RM_E5 and the sixth stem RM_E6 may have a width smaller than a width of the third electrode RME3 disposed in the area EMA.

In an embodiment, a distance between the first stem RM_E1 and the third stem RM_E3 may be greater than a distance between a portion of the first electrode RME1 excluding the first stem RM_E1 and a portion of the second electrode RME2 excluding the third stem RM_E3. The first dummy light-emitting element EED1 may be disposed between the portion of the first electrode RME1 excluding the first stem RM_E1 and the portion of the second electrode RME2 excluding the third stem RM_E3. For example, in case that an alignment signal is applied to the first electrode RME1 and the second electrode RME2, a strong electric field may be generated in an area between the portion of the first electrode RME1 except the first stem RM_E1 and the portion of the second electrode RME2 except the third stem RM_E3. Thus, the light-emitting elements may move to this area. Thus, the first dummy light-emitting element EED1 may be disposed in this area. For example, the dummy light-emitting elements may not be disposed between the first stem RM_E1 and the third stem RM_E3.

A distance between the second stem RM_E2 and the fourth stem RM_E4 may be greater than a distance between a portion of the first electrode RME1 excluding the second stem RM_E2 and a portion of the second electrode RME2 excluding the fourth stem RM_E4. The second dummy light-emitting element EED2 may be disposed between the portion of the first electrode RME1 excluding the second stem RM_E2 and the portion of the second electrode RME2 excluding the fourth stem RM_E4. For example, in case that an alignment signal is applied to the first electrode RME1 and the second electrode RME2, a strong electric field may be generated in an area between the portion of the first electrode RME1 except the second stem RM_E2 and the portion of the second electrode RME2 except the fourth stem RM_E4, and thus the light-emitting elements may move to the area. The second dummy light-emitting element EED2 may be disposed in this area. For example, the dummy light-emitting elements may not be disposed between the second stem RM_E2 and the fourth stem RM_E4.

A distance between the first stem RM_E1 and the fifth stem RM_E5 may be greater than a distance between a portion of the first electrode RME1 excluding the first stem RM_E1 and a portion of the third electrode RME3 excluding the fifth stem RM_E5. The third dummy light-emitting element EED3 may be disposed between the portion of the first electrode RME1 excluding the first stem RM_E1 and the portion of the third electrode RME2 excluding the fifth stem RM_E5. For example, in case that an alignment signal is applied to the first electrode RME1 and the third electrode RME3, a strong electric field may be generated in an area between the portion of the first electrode RME1 except for the first stem RM_E1 and the portion of the third electrode RME3 except for the fifth stem RM_E5, and thus the light-emitting element may move to the area. Thus, the third dummy light-emitting element EED1 may be disposed in this area. For example, the dummy light-emitting elements may not be disposed between the first stem RM_E1 and the fifth stem RM_E5.

A distance between the second stem RM_E2 and the sixth stem RM_E6 may be greater than a distance between a portion of the first electrode RME1 excluding the second stem RM_E2 and a portion of the third electrode RME3 excluding the sixth stem RM_E6. The fourth dummy light-emitting element EED4 may be disposed between the portion of the first electrode RME1 excluding the second stem RM_E2 and the portion of the third electrode RME3 excluding the sixth stem RM_E6. For example, in case that an alignment signal is applied to the first electrode RME1 and the third electrode RME3, a strong electric field is generated in an area between the portion of the first electrode RME1 except for the second stem RM_E2 and the portion of the third electrode RME3 except for the sixth stem RM_E6, and thus the light-emitting element may move to the area. Thus, the fourth dummy light-emitting element EED4 is disposed in the area. For example, the dummy light-emitting elements may not be disposed between the second stem RM_E2 and the sixth stem RM_E6.

In this embodiment, a distance between portions of the electrodes RME adjacent to the isolation area ROP is larger than a distance between portions of the electrodes RME away from the isolation area ROP. Thus, in case that the ink overflows into the sub-area SA, the light-emitting elements may be prevented from being disposed in the isolation area ROP.

Figure 12:
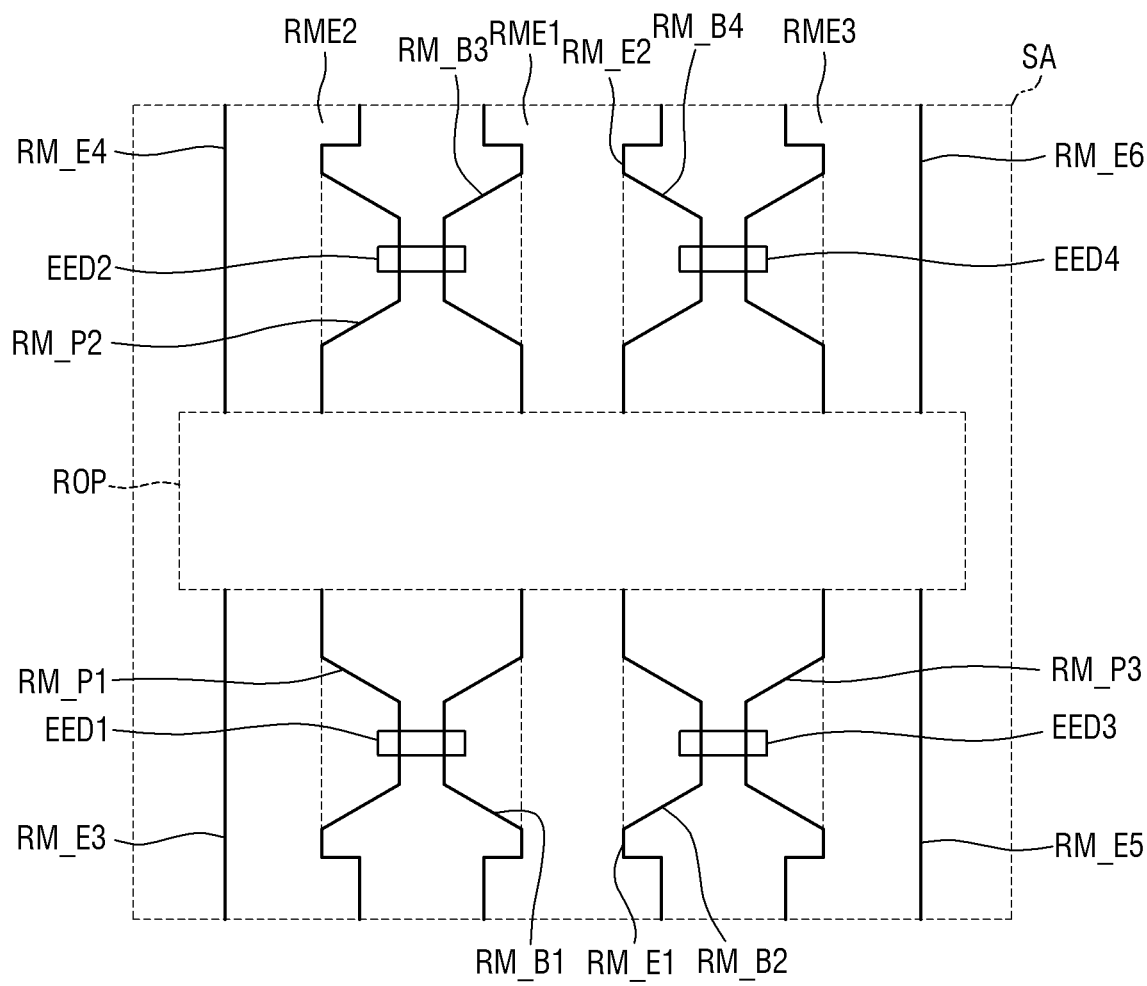
FIG. 12 is a plan view showing a sub-area of one sub-pixel of a display device according to still another embodiment.
Figure 12:
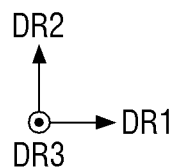

FIG. 12 is a plan view showing a sub-area of one sub-pixel of a display device according to still another embodiment.

Referring to FIG. 12, this embodiment is different from the embodiment of FIG. 3 to FIG. 10 in that shapes of the branches of the first electrode RME1 and the protrusions of the second electrode RME2 and the third electrode RME3 are modified. Hereinafter, descriptions duplicate with those of the above-described embodiments will be omitted and following descriptions will be based on differences therebetween.

As described above, the first electrode RME1, the second electrode RME2, and the third electrode RME3 may extend from the light-emitting area to the sub-area SA. Each of the first electrode RME1, the second electrode RME2, and the third electrode RME3 may be disconnected in the isolation area ROP and may be divided into portions spaced apart from each other in the area ROP.

The first electrode RME1 may include a first stem RM_E1 and a second stem RM_E2 spaced apart from each other while the isolation area ROP is therebetween, and may include a first branch RM_B1 and a second branch RM_B2 branched from the first stem RM_E1, and a third branch RM_B3 and a fourth branch RM_B4 branched from the second stem RM_E2.

In the embodiment, each of the first branch RM_B1, the second branch RM_B2, the third branch RM_B3, and the fourth branch RM_B4 may have a trapezoidal planar shape.

The trapezoidal shape may be, for example, an isosceles trapezoid. For example, the first branch RM_B1 may protrude from the first stem RM_E1 toward the second electrode RME2 adjacent thereto. The third branch RM_B3 may protrude from the second stem RM_E2 toward the second electrode RME2 adjacent thereto. An upper side of the equilateral trapezoid of the first branch RM_B1 may extend adjacent to the second electrode RME2, and a lower side of the equilateral trapezoid of the first branch RM_B1 may be integrated with the first stem RM_E1. An upper side of the equilateral trapezoid of the third branch RM_B3 may extend adjacent to the second electrode RME2, and a lower side of the equilateral trapezoid of the third branch RM_B3 may be integrated with the second stem RM_E2. The second branch RM_B2 may protrude from the first stem RM_E1 toward the third electrode RME3 adjacent thereto. The fourth branch RM_B4 may protrude from the second stem RM_E2 toward the third electrode RME3 adjacent thereto. An upper side of the equilateral trapezoid of the second branch RM_B2 may protrude adjacent to the third electrode RME3, and a lower side of the equilateral trapezoid thereof may be integrated with the first stem RM_E1. An upper side of the equilateral trapezoid of the fourth branch RM_B4 may protrude adjacent to the third electrode RME3, and a lower side of the equilateral trapezoid thereof may be integrated with the second stem RM_E2.

The second electrode RME2 may include a third stem RM_E3 and a fourth stem RM_E4 extending in the second direction DR2, and a first protrusion RM_P1 protruding from the third stem RM_E3, and a second protrusion RM_P2 protruding from the fourth stem RM_E4. Each of the first protrusion RM_P1 and the second protrusion RM_P2 may have a trapezoidal planar shape. The trapezoidal shape may be, for example, an isosceles trapezoid. For example, the first protrusion RM_P1 may protrude from the third stem RM_E3 toward the first electrode RME1 adjacent thereto. The second protrusion RM_P2 may protrude from the fourth stem RM_E4 toward the first electrode RME1 adjacent thereto. An upper side of the isosceles trapezoid of the first protrusion RM_P1 may protrude adjacent to the first electrode RME1 and a lower side of the equilateral trapezoid thereof may be integrated with the third stem RM_E3. An upper side of the isosceles trapezoid of the second protrusion RM_P2 may protrude adjacent to the first electrode RME1 and a lower side of the equilateral trapezoid thereof may be integrated with the fourth stem RM_E4.

The third electrode RME3 may include a fifth stem RM_E5 and a sixth stem RM_E6 extending in the second direction DR2, a third protrusion RM_P3 protruding from the fifth stem RM_E5, and a fourth protrusion RM_P4 protruding from the sixth stem RM_E6. Each of the third protrusion RM_P3 and the fourth protrusion RM_P4 may have a trapezoidal planar shape. The trapezoidal shape may be, for example, an isosceles trapezoid. For example, the third protrusion RM_P3 may protrude from the fifth stem RM_E5 toward the first electrode RME1 adjacent thereto. The fourth protrusion RM_P4 may protrude from the sixth stem RM_E6 toward the first electrode RME1 adjacent thereto. An upper side of the isosceles trapezoid of the third protrusion RM_P3 may protrude adjacent to the first electrode RME1 and a lower side of the equilateral trapezoid thereof may be integrated with the fifth stem RM_E5. An upper side of the isosceles trapezoid of the fourth protrusion RM_P4 may protrude adjacent to the first electrode RME1 and a lower side of the equilateral trapezoid thereof may be integrated with the sixth stem RM_E6.

Planar area sizes of the first branch RM_B1, the second branch RM_B2, the third branch RM_B3, and the fourth branch RM_B4 may be equal to each other. For example, the area sizes of the isosceles trapezoids of the branches RM_B1, RM_B2, RM_B3, and RM_B4 in a plan view may be equal to each other. However, the disclosure is not limited thereto, and the planar area sizes of the branches RM_B1, RM_B2, RM_B3, and RM_B4 may be different from each other. Planar area sizes of the first protrusion RM_P1, the second protrusion RM_P2, the third protrusion RM_P3, and the fourth protrusion RM_P4 may be equal to each other. For example, the area sizes of the isosceles trapezoids of the protrusions RM_P1, RM_P2, RM_P3, and RM_P4 in a plan view may be equal to each other. However, the disclosure is not limited thereto, and the planar area sizes of the protrusions RM_P1, RM_P2, RM_P3, and RM_P4 may be different from each other.

According to an embodiment, the first protrusion RM_P1 may be disposed adjacent to the first branch RM_B1 and may be disposed to face the first branch RM_B1. A side of the first protrusion RM_P1 and a side of the first branch RM_B1 may be disposed adjacent to each other and may extend in a parallel manner to each other. In case that an alignment signal is applied to the first electrode RME1 and the second electrode RME2, the first dummy light-emitting element EED1 may be disposed between the side of the first protrusion RM_P1 and the side of the first branch RM_B1 in an aligned manner. The second protrusion RM_P2 may be disposed adjacent to the third branch RM_B3 and may face the third branch RM_B3. A side of the second protrusion RM_P2 and a side of the third branch RM_B3 may be disposed adjacent to each other and may extend in a parallel manner to each other. In case that an alignment signal is applied to the first electrode RME1 and the second electrode RME2, the second dummy light-emitting element EED2 may be disposed between the side of the second protrusion RM_P2 and the side of the third branch RM_B3 in an aligned manner. The third protrusion RM_P3 may be disposed adjacent to the second branch RM_B2 and may face the second branch RM_B2. A side of the third protrusion RM_P3 and a side of the second branch RM_B2 may be adjacent to each other and may extend in a parallel manner to each other. In case that an alignment signal is applied to the first electrode RME1 and the third electrode RME3, the third dummy light-emitting element EED3 may be disposed between the side of the third protrusion RM_P3 and the side of the second branch RM_B2 in an aligned manner. The fourth protrusion RM_P4 may be disposed adjacent to the fourth branch RM_B4 and may face the fourth branch RM_B4. A side of the fourth protrusion RM_P4 and a side of the fourth branch RM_B4 may be adjacent to each other and may extend in a parallel manner to each other. In case that an alignment signal is applied to the first electrode RME1 and the third electrode RME3, the fourth dummy light-emitting element EED4 may be disposed between the side of the fourth protrusion RM_P4 and the side of the fourth branch RM_B4 in an aligned manner.

In an embodiment, even in case that the ink containing the light-emitting elements ED overflows into the sub-area SA, an alignment signal may be applied to each of the electrodes RME to move the light-emitting elements ED into an area other than the isolation area ROP of the sub-area SA and align the light-emitting elements ED, thereby preventing defects.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
    a bank layer disposed on a substrate and defining a light-emitting area and a sub-area spaced apart from the light-emitting area;
    a first electrode and a second electrode spaced apart from each other and extending from the light-emitting area to the sub-area;
    a plurality of light-emitting elements disposed on the first electrode and the second electrode in the light-emitting area;
    a plurality of dummy light-emitting elements disposed on the first electrode and the second electrode in the sub-area;
    a first connection electrode in electrical contact with an end of each of the plurality of light-emitting elements; and
    a second connection electrode in electrical contact with another end of each of the plurality of light-emitting elements, wherein
    the sub-area includes an isolation area in which each of the first electrode and the second electrode is disconnected, and
    the plurality of dummy light-emitting elements are not disposed in the isolation area.

2. The device of claim 1, wherein each of the plurality of dummy light-emitting elements is spaced apart from the first connection electrode and the second connection electrode.

3. The device of claim 1, wherein in the sub-area, the first electrode includes:
    a first stem;
    a second stem spaced apart from the first stem;
    a first branch protruding from the first stem toward the second electrode; and
    a second branch protruding from the second stem toward the second electrode, and
    the isolation area is disposed between the first stem and the second stem.

4. The device of claim 3, wherein in the sub-area, the second electrode includes:
    a third stem;
    a fourth stem spaced apart from the third stem;
    a first protrusion protruding from the third stem toward the first electrode; and
    a second protrusion protruding from the fourth stem toward the first electrode, and
    the isolation area is disposed between the third stem and the fourth stem.

5. The device of claim 4, wherein
    the first branch and the first protrusion extend in a parallel manner to each other and face each other, and
    the second branch and the second protrusion extend in a parallel manner to each other and face each other.

6. The device of claim 4, wherein the plurality of dummy light-emitting elements include:
    a first dummy light-emitting element disposed between the first branch and the first protrusion; and
    a second dummy light-emitting element disposed between the second branch and the second protrusion.

7. The device of claim 4, wherein the first stem, the first branch, the third stem, and the first protrusion are respectively symmetrical with the second stem, the second branch, the fourth stem, and the second protrusion with respect to the isolation area.

8. The device of claim 4, wherein
    widths of the first branch and the second branch are equal to each other,
    lengths of the first branch and the second branch are equal to each other,
    widths of the first protrusion and the second protrusion are equal to each other, and
    lengths of the first protrusion and the second protrusion are equal to each other.

9. The device of claim 3, further comprising:
    a third electrode extending from the light-emitting area to the sub-area, wherein
    the third electrode is spaced apart from the second electrode,
    the first electrode is disposed between the second electrode and the third electrode, and
    the third electrode is disconnected in the isolation area.

10. The device of claim 9, wherein in the sub-area, the first electrode includes:
    a third branch protruding from the first stem toward the third electrode; and
    a fourth branch protruding from the second stem toward the third electrode.

11. The device of claim 10, wherein in the sub-area, the third electrode includes:
    a fifth stem;
    a sixth stem spaced apart from the fifth stem;
    a third protrusion protruding from the fifth stem toward the first electrode; and
    a fourth protrusion protruding from the sixth stem toward the first electrode, and
    the isolation area disposed between the fifth stem and the sixth stem.

12. The device of claim 11, wherein
    the third branch and the third protrusion extend in a parallel manner to each other and face each other, and
    the fourth branch and the fourth protrusion extend in a parallel manner to each other and face each other.

13. The device of claim 11, wherein the plurality of dummy light-emitting elements include:
    a third dummy light-emitting element disposed between the third branch and the third protrusion, and
    a fourth dummy light-emitting element disposed between the fourth branch and the fourth protrusion.

14. The device of claim 11, wherein the third branch, the fifth stem, and the third protrusion are respectively symmetrical with the fourth branch, the sixth stem, and the fourth protrusion with respect to the isolation area.

15. The device of claim 11, wherein
    the third branch and the fourth branch have a same width and a same length, and
    the third protrusion and the fourth protrusion have a same width and a same length.

16. A display device comprising:
    a bank layer disposed on a substrate and defining a light-emitting area and a sub-area spaced apart from the light-emitting area;

electrodes comprising a first electrode and a second electrode spaced apart from each other and extending from the light-emitting area to the sub-area;

a plurality of light-emitting elements disposed on the first electrode and the second electrode in the light-emitting area;

a plurality of dummy light-emitting elements disposed on the first electrode and the second electrode in the sub-area;

a first connection electrode in electrical contact with an end of each of the plurality of light-emitting elements; and a second connection electrode in electrical contact with another end of each of the plurality of light-emitting elements, wherein each of the plurality of dummy light-emitting elements is spaced apart from the first connection electrode and the second connection electrode.

17. The device of claim 16, further comprising:

a first insulating layer disposed between the electrodes and the plurality of dummy light-emitting elements, wherein an end of each of the plurality of dummy light-emitting elements is disposed on the first electrode, and the another end of each of the plurality of dummy light-emitting elements is disposed on the second electrode.

18. The device of claim 17, further comprising:

a second insulating layer disposed on the plurality of dummy light-emitting elements and the first insulating layer, wherein the second insulating layer is in direct contact with a top face and sides of each of the plurality of dummy light-emitting elements.

19. The device of claim 16, wherein in the sub-area, the first electrode includes a first stem, the second electrode includes a second stem, a width of the first stem is smaller than a width of the first electrode in the light-emitting area, and a width of the second stem is smaller than a width of the second electrode in the light-emitting area.

20. The device of claim 19, wherein each of the plurality of dummy light-emitting elements is disposed between the first electrode the second electrode, and each of the plurality of dummy light-emitting elements is not disposed between the first stem and the second stem.

* * * * *